United States Patent
Yu et al.

(10) Patent No.: US 8,987,811 B2
(45) Date of Patent: Mar. 24, 2015

(54) SEMICONDUCTOR DEVICES INCLUDING A VERTICAL CHANNEL TRANSISTOR AND METHODS OF FABRICATING THE SAME

(75) Inventors: Hak-soo Yu, Seongnam-si (KR); Chulwoo Park, Yongin-si (KR); Hyun-Woo Chung, Seoul (KR); Sua Kim, Seongnam-si (KR); Hyunho Choi, Suwon-si (KR); Hongsun Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 216 days.

(21) Appl. No.: 13/588,513

(22) Filed: Aug. 17, 2012

(65) Prior Publication Data

US 2013/0043525 A1     Feb. 21, 2013

(30) Foreign Application Priority Data

Aug. 19, 2011  (KR) .................. 10-2011-0082910

(51) Int. Cl.
*H01L 29/66*    (2006.01)
*H01L 27/108*   (2006.01)

(52) U.S. Cl.
CPC .... *H01L 27/10823* (2013.01); *H01L 27/10814* (2013.01); *H01L 27/10855* (2013.01); *H01L 27/10876* (2013.01); *H01L 27/10885* (2013.01)
USPC ........... 257/329; 438/262; 257/330; 257/331; 257/332; 257/333; 257/334; 257/E29.131

(58) Field of Classification Search
CPC ............... H01L 27/11273; H01L 27/2454
USPC ............ 257/329, 330, 331, 332, 333, 334, 257/E29.131; 438/262
See application file for complete search history.

(56) References Cited

U.S. PATENT DOCUMENTS

| | | | |
|---|---|---|---|
| 6,004,848 A * | 12/1999 | Shone | ........................... 438/278 |
| 6,576,945 B2 | 6/2003 | Mandelman et al. | |
| 6,593,613 B1 | 7/2003 | Alsmeier et al. | |
| 6,762,447 B1 | 7/2004 | Mandelman et al. | |
| 7,109,544 B2 | 9/2006 | Schloesser et al. | |

(Continued)

FOREIGN PATENT DOCUMENTS

| JP | 2000228504 A | 8/2000 |
|---|---|---|
| JP | 2002134631 A | 5/2002 |
| KR | 100500219 B1 | 7/2005 |
| KR | 20070038233 A | 4/2007 |

OTHER PUBLICATIONS

J.A. Mandelman et al., "Floating-Body Concerns for SOI Dynamic Random Access Memory (DRAM)," Proceedings 1996 IEEE International SOI Conference, Oct. 1996.

*Primary Examiner* — Matthew W Such
*Assistant Examiner* — Samuel Lair
(74) *Attorney, Agent, or Firm* — Harness, Dickey & Pierce, PLC

(57) ABSTRACT

According to example embodiments, a semiconductor device includes a plurality of active pillars protruding from a substrate. Each active pillar includes a channel region between upper and lower doped regions. A contact gate electrode faces the channel region and is connected to a word line. The word line extends in a first direction. A bit line is connected to the lower doped region and extends in a second direction. The semiconductor device further includes a string body connection portion that connects the channel region of at least two adjacent active pillars of the plurality of active pillars.

19 Claims, 44 Drawing Sheets

(56) References Cited

U.S. PATENT DOCUMENTS

| | | |
|---|---|---|
| 7,586,149 B2 | 9/2009 | Yoon et al. |
| 2008/0242025 A1* | 10/2008 | Kim et al. ............... 438/262 |
| 2013/0056812 A1* | 3/2013 | Kim et al. ............... 257/295 |
| 2013/0099305 A1* | 4/2013 | Kim et al. ............... 257/329 |

* cited by examiner

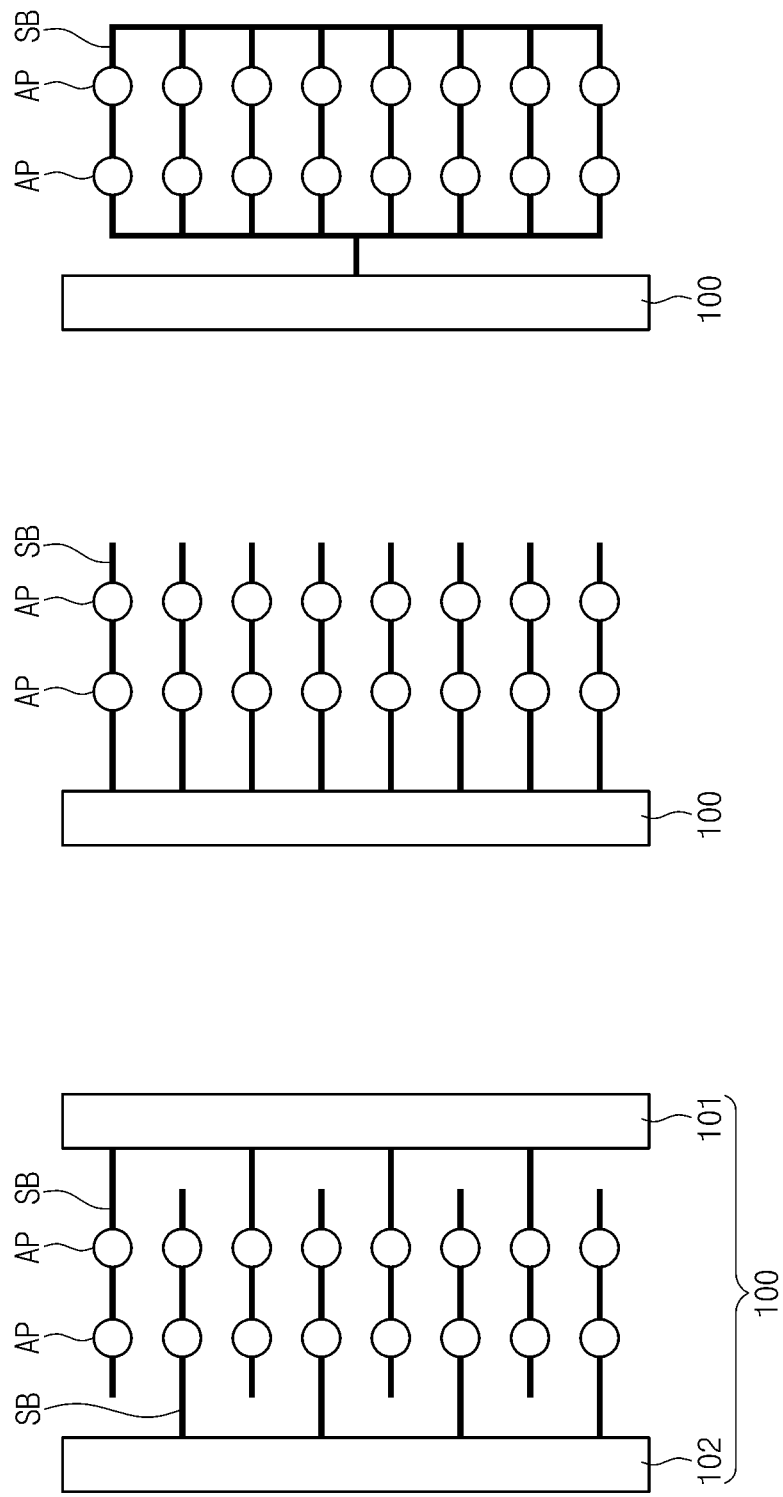

SEMICONDUCTOR DEVICES INCLUDING A VERTICAL CHANNEL TRANSISTOR AND METHODS OF FABRICATING THE SAME

CROSS-REFERENCE TO RELATED APPLICATIONS

This application claims priority under 35 U.S.C. §119 to Korean Patent Application No. 10-2011-0082910, filed on Aug. 19, 2011, in the Korean Intellectual Property Office, the entire contents of which are hereby incorporated by reference.

BACKGROUND

Example embodiments of inventive concepts generally relate to semiconductor devices, and more particularly, to semiconductor devices including a vertical channel transistor and/or to methods of fabricating the same.

Due to their small-sized, multifunctional, and/or low-cost characteristics, semiconductor devices are used in the electronic industry. Higher integration of semiconductor memory devices is desired to satisfy consumer demands for superior performance and inexpensive prices. In the case of semiconductor memory devices, increased integration is desired because integration can affect product prices. However, the process equipment for increasing pattern fineness may be expensive and can set a practical limitation on increasing integration for semiconductor memory devices.

New technology is being studied for increasing the integration density of semiconductor memory devices. For example, a semiconductor memory device may include a vertical transistor having a vertical channel and source and drain regions vertically spaced apart from each other by the vertical channel. However, for the vertical transistor, the source or drain region may be interposed between the vertical channel and a substrate, such that the vertical channel is in a floated state. The floating of the vertical channel may lead to an accumulation of holes in the vertical channel and/or a formation of subthreshold and/or parasitic bipolar junction transistor. Furthermore, for example, in a dynamic random access memory (DRAM), this may result in a leakage current between a capacitor node and a bit line node and deteriorate a data retention property of memory cell.

SUMMARY

Example embodiments of inventive concepts relate to a semiconductor device including a vertical transistor, in which is configured to limit (and/or prevent) a channel region thereof from being in a floating state, and a method of fabricating the same.

According to example embodiments of inventive concepts, a semiconductor device may include a plurality of active pillars protruding from a substrate. Each of the active pillars includes upper and lower doped regions that are spaced apart from each other, and a channel region between the upper and lower doped regions. A contact gate electrode faces the channel region and is connected to a word line extending along a first direction. A bit line is connected to the lower doped region and extends along a second direction crossing the first direction, and a string body connection portion connects the channel regions of at least two adjacent active pillars of the plurality of active pillars.

A top surface of the string body connection portion may be lower than a bottom surface of the upper doped region.

The string body connection portion may have the same conductivity type as the channel region.

The device may further include an insulating gap-fill pattern on the string body connection portion, the insulating gap-fill pattern between the at least two active pillars of the plurality of active pillars, and a separation doped region in contact with a bottom surface of the insulating gap-fill pattern. The separation doped region may be spaced apart from the lower doped region. A conductivity type of the separation doped region may be the same as a conductivity type of the channel region. An impurity concentration of the separation doped region may be greater than an impurity concentration of the channel region.

The insulating gap-fill pattern may extend along the first direction.

The string body connection portion may extend along the second direction to connect the channel regions of the at least two adjacent active pillars of the plurality of active pillars.

In example embodiments, the string body connection portion may be used as a pathway for an extraction of holes from the channel region.

The device may further include at least one voltage generation portion electrically connected to the string body connection portion.

The string body connection portion may include a plurality of linear portions that extend in the second direction and are arranged in even and odd rows. The at least one voltage generation portion may include first and second voltage generation portions. The first voltage generation portion may be connected to the odd rows the plurality of linear portions of the string body connection portion. The second voltage generation portion may be connected to the even rows of the plurality of the linear portions of the string body connection portion. The plurality of linear portions of the string body connection portion may be between the first and second voltage generation portions.

The string body connection portion and the substrate may be configured to receive equal applied voltages.

The word line may expose a portion of a top surface of the contact gate electrode and at least a portion of a top surface of the active pillar.

The word line may be arranged so a vertical position of the word line does not overlap with a vertical position of the plurality of active pillars.

A width of the contact gate electrode in a direction parallel to the bit line may be greater than a width of the contact gate electrode in a direction parallel to the word line.

The device may further include a data storing element electrically connected to the upper doped regions of the plurality of the active pillars.

The lower doped regions of the plurality of active pillars may have a line shape that extends along the second direction.

According to example embodiments of inventive concepts, a semiconductor device may include an active pillar protruding from a substrate, the active pillar including an upper doped region and a lower doped regions and a channel region between the upper and lower doped regions, a word line extending along a first direction over the substrate, a contact gate electrode connected to the word line to face the channel region, a bit line connected to the lower doped region and extending along a second direction crossing the first direction, and a string body connection portion connected to the channel region.

According to example embodiments of inventive concepts, a method of fabricating a semiconductor device may include forming an isolation layer in a substrate that defines at least one active line that is parallel to the isolation layer, patterning a portion of the device isolation layer to form a first groove pattern defining at least one first groove parallel to the active line, the first groove pattern exposing a portion of a sidewall of the at least one active line, forming at least one bit line and at least one lower doped region connected with each other below the first groove pattern, patterning the at least one active line and the device isolation layer to form a second groove pattern including at least one second groove, the second groove pattern crossing the at least one active line to define at least one active pillar and at least one string body connection portion connected with each other, forming an insulating gap-fill pattern to fill the second groove pattern, forming a contact gate on the at least one bit line, the contact gate being spaced apart from the at least one bit line to face the at least one active pillar, forming an upper doped region in an upper portion of the active pillar, and forming a word line being spaced apart from the at least one active pillar and in contact with the contact gate.

According to example embodiments of inventive concepts, a method of fabricating a semiconductor device may include forming a bit line and a lower doped region in a substrate, the bit line and the lower doped region being parallel to each other, forming an active pillar and a string body connection portion, the active pillar and the string body connection portion being connected on the lower doped region, forming a contact gate on the bit line, the contact gate being spaced apart from the bit line to face a sidewall of the active pillar, forming an upper doped region in an upper portion of the active pillar, and forming a word line spaced apart from the active pillar and is connected to the contact gate.

According to example embodiments, a semiconductor device includes a plurality of vertical transistors arranged in rows and columns. Each vertical transistor includes a channel between a first and a second doped region, and a gate electrode configured to apply a gate voltage to the channel region. The semiconductor device further includes at least one word line connected to the gate electrodes of one row of the plurality of vertical transistors, at least one bit line connected to the first doped regions of one column of the plurality of vertical transistors, and at least one string body connection portion that connects the channel regions of at least two of the plurality of vertical transistors.

The at least one string body connection portion may extend between the channel and the first doped regions of the at least two of the plurality of the vertical transistors, and the at least one string body connection portion may be configured to extract holes from the channel regions of the at least two of the plurality of the vertical transistors.

The semiconductor device may further include a plurality of data storage elements, wherein each of the data storage elements is connected to one second doped region of the plurality of vertical transistors.

According to example embodiments, an electronic device includes at least one of the foregoing semiconductor devices according to example embodiments and a controller configured to the control the semiconductor device.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 3 to 6(a) are sectional views illustrating sections taken along lines III-III, IV-IV, V-V, and VI-VI of FIG. 2;

FIGS. 9(a) to 12(a), 9(b) to 12(b), 9(c) to 12(c), 9(d) to 12(d), 9(e) to 12(e), 9(f) to 12(f), 9(g) to 12(g), 9(h) to 12(h), and 9(i) to 12(i) are sectional views taken along lines IX-IX, X-X, XI-XI, and XII-XII of FIGS. 8(a) through 8(g) and illustrating a method of fabricating the semiconductor device of FIGS. 2 to 5, and 6(a);

FIGS. 13A to 13C are schematic diagrams illustrating electric connections between string body connection portions and voltage generators according to example embodiments of inventive concepts;

Figure 1:
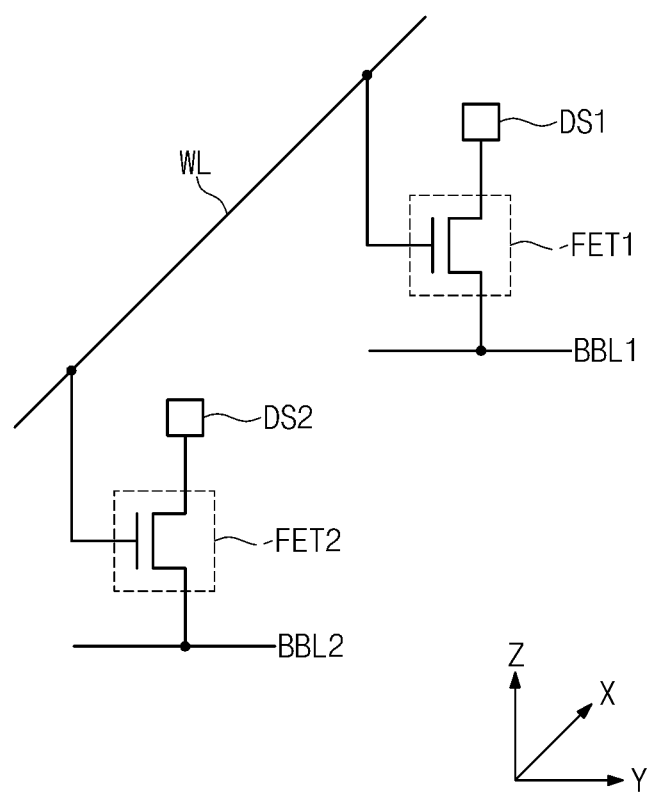
FIG. 1 is a circuit diagram schematically illustrating a semiconductor device including vertical channel transistors according to example embodiments of inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of like reference numbers in the various drawings is intended to indicate the presence of a like element or feature.

DETAILED DESCRIPTION

Example embodiments of inventive concepts will now be described more fully with reference to the accompanying drawings, in which some example embodiments are shown. Example embodiments of inventive concepts may, however, be embodied in many different forms and should not be construed as being limited to the embodiments set forth herein; rather, these example embodiments are provided so that this disclosure will be thorough and complete, and will fully convey the scope of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a circuit diagram schematically illustrating a semiconductor device including vertical channel transistors according to example embodiments of inventive concepts.

Referring to FIG. 1, a semiconductor device according to example embodiments of inventive concepts may include a plurality of transistors. For instance, the transistors may include a first vertical channel transistor FET1 and a second vertical channel transistor FET2. Gate electrodes of the first and second vertical channel transistors FET1 and FET2 may be electrically connected in common to a single word line WL.

A first drain electrode of the first vertical channel transistor FET1 may be electrically connected to a first buried bit line BBL1, and a second drain electrode of the second vertical channel transistor FET2 may be electrically connected to a second buried bit line BBL2. The first buried bit line BBL1 and the second buried bit line BBL2 may be electrically separated from each other such that they can be independently controlled. The word line WL may be disposed to cross the first and second buried bit lines BBL1 and BBL2.

According to example embodiments of inventive concepts, a first data storing element DS 1 may be electrically coupled to a first source electrode of the first vertical channel transistor FET1, and a second data storing element DS2 may be electrically coupled to a second source electrode of the second vertical channel transistor FET2. According to example embodiments of inventive concepts, the first vertical channel transistor FET1 and the first data storing element DS1 may be included in a unit memory cell, and similarly, the second vertical channel transistor FET2 and the second data storing element DS2 may be included in another unit memory cell. Each of the first and second vertical channel transistors FET1 and FET2 may serve as switching devices controlling electric connections between the first and second data storing elements DS1 and DS2 and the first and second buried bit lines BBL1 and BBL2. Various types of memory elements can be used for the first and second data storing elements DS1 and DS2. For example, the first and second data storing elements DS1 and DS2 may be realized using one of a capacitor, a magnetic tunnel junction (MTJ) pattern, or a variable resistance structure. In other words, the semiconductor device according to example embodiments of inventive concepts may be realized as one of a volatile memory device, a non-volatile memory device, a magnetic memory device, or a resistive memory device. But example embodiments of inventive concepts are not limited thereto.

Hereinafter, semiconductor devices according to example embodiments of inventive concepts and methods of fabricating the same will be described in more detail with reference to the accompanying drawings.

Figure 2:
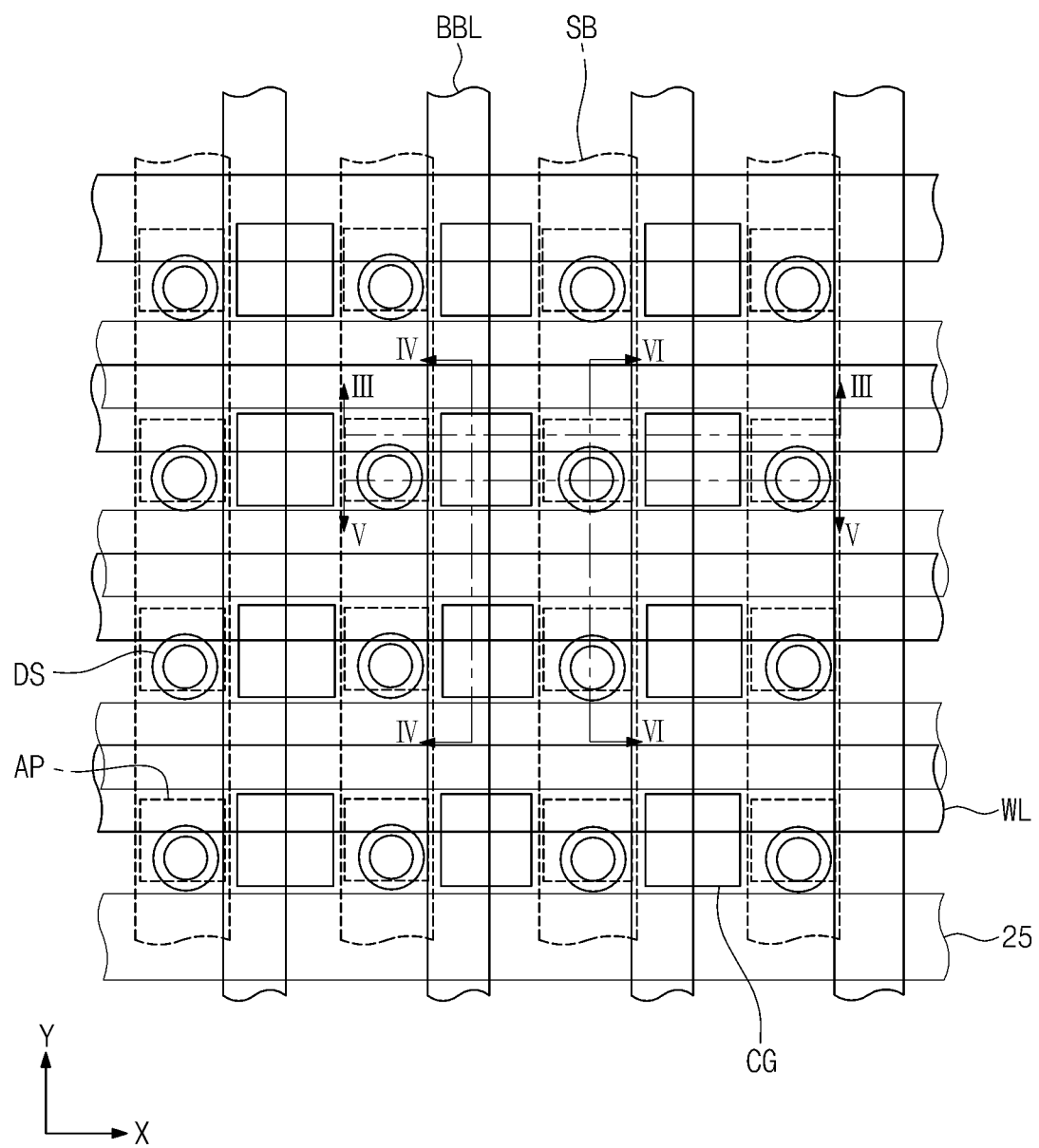
FIG. 2 is a plan view of a semiconductor device according to example embodiments of inventive concepts.
Figure 6A:
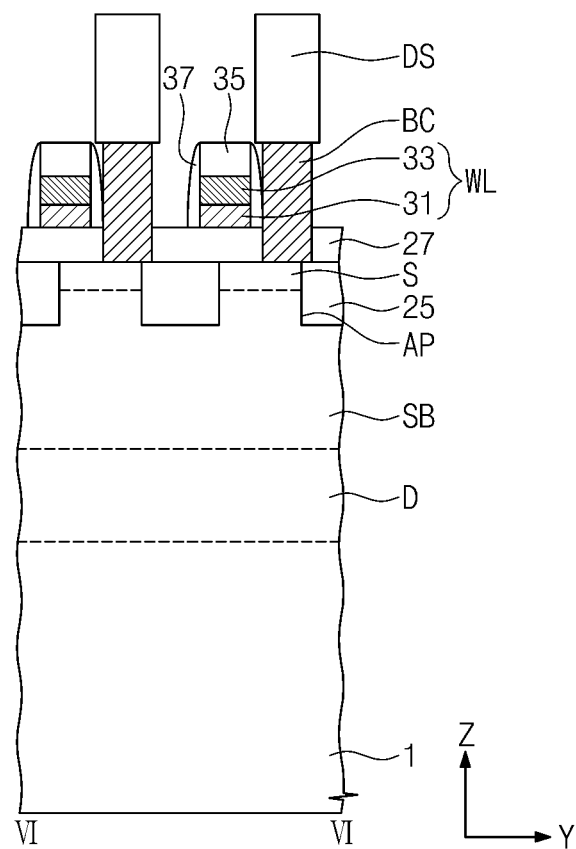
Figure 7:
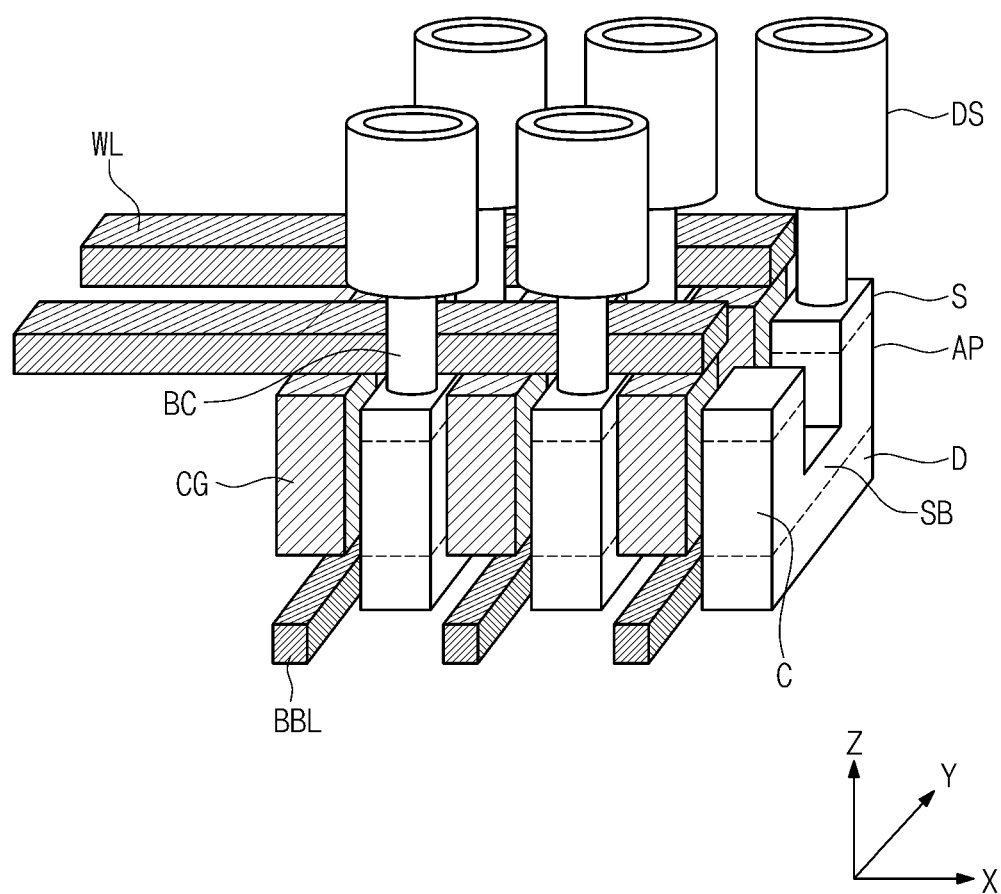
FIG. 7 is a perspective view of a semiconductor device according to example embodiments of inventive concepts.
Figure 8A:
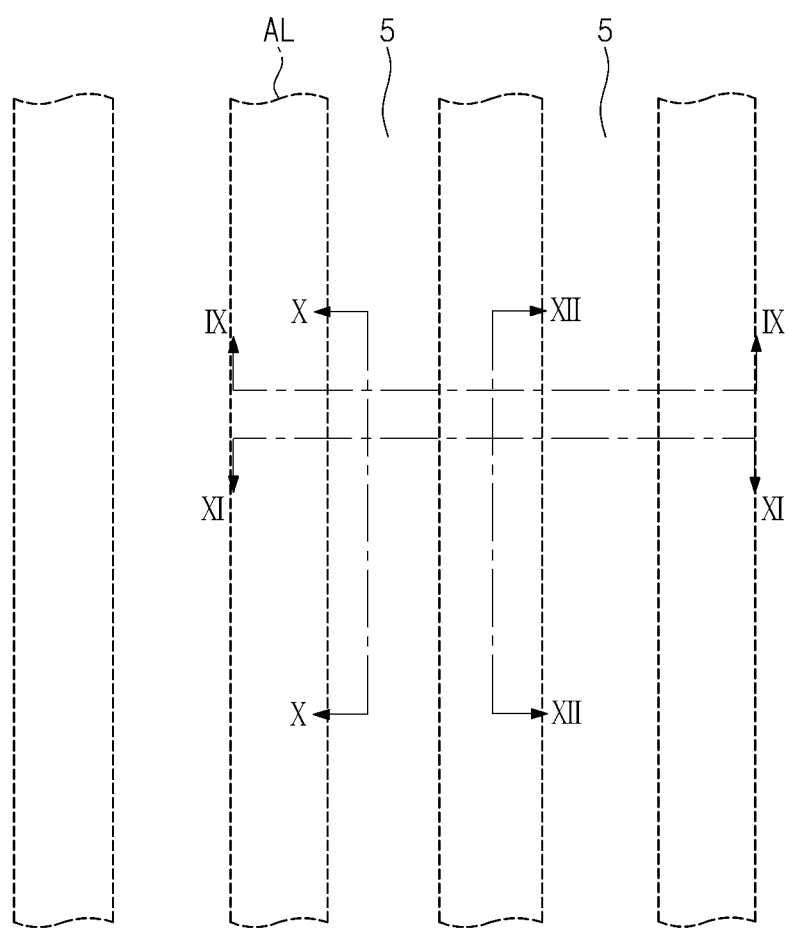
FIGS. 8(a) through 8(g) are plan views sequentially illustrating a method of fabricating the semiconductor device of FIG. 2.
Figure 8B:
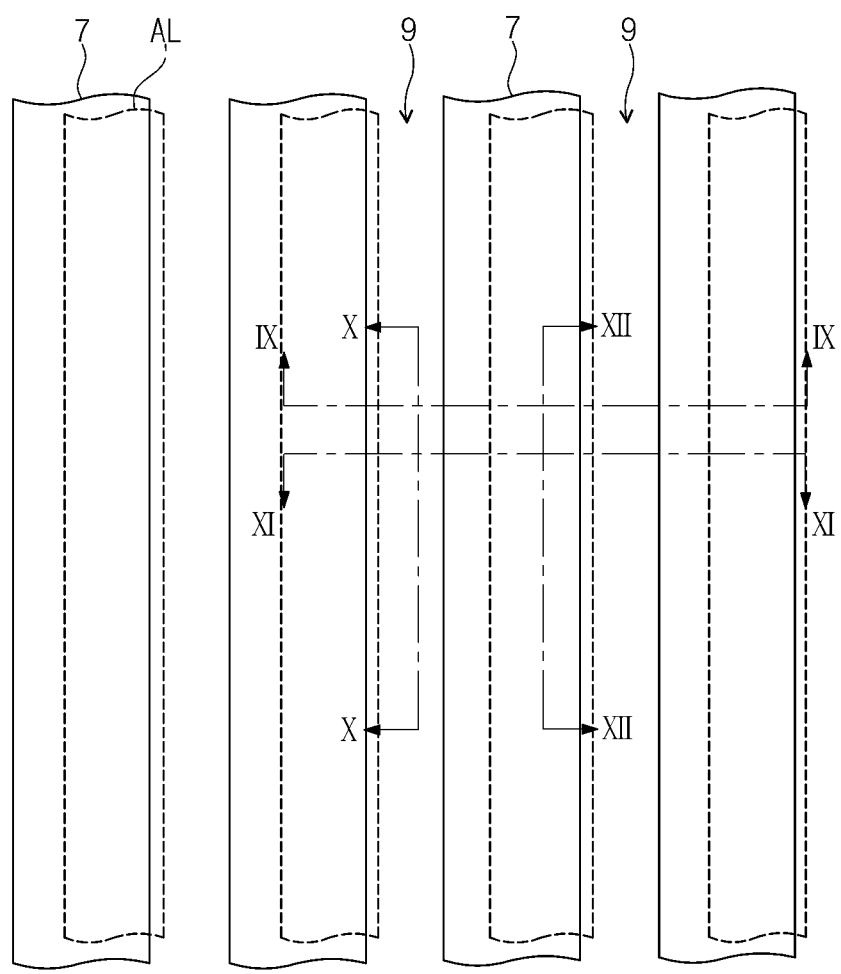
Figure 8C:
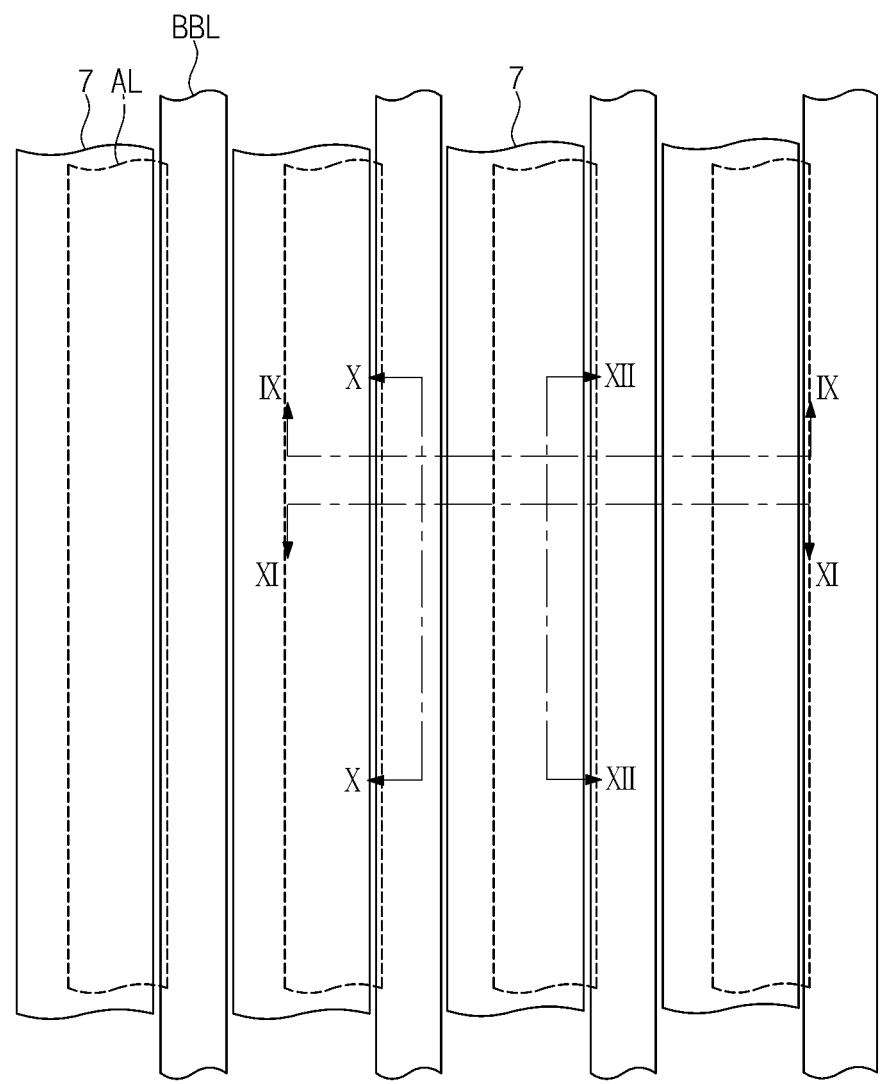
Figure 8D:
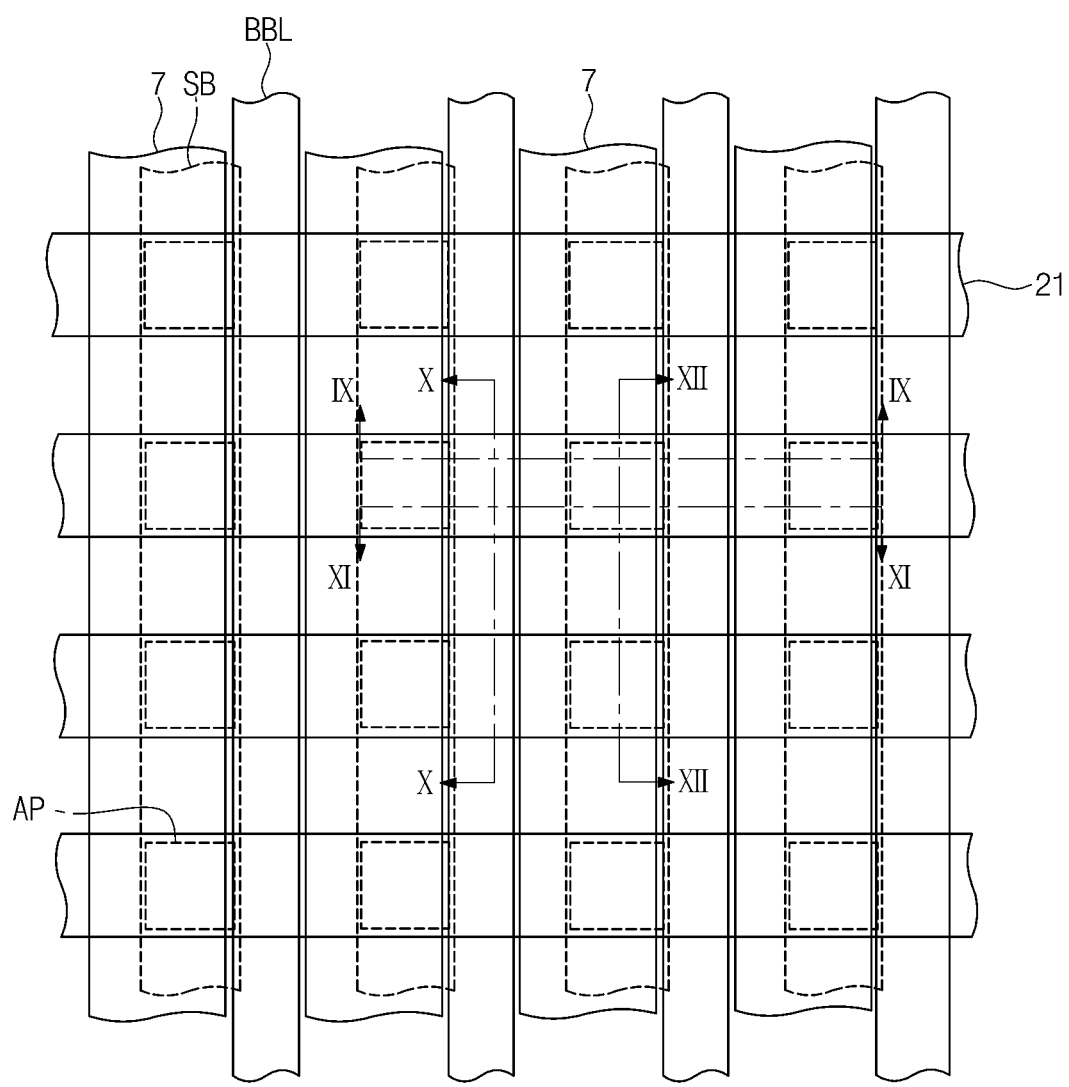
Figure 8E:
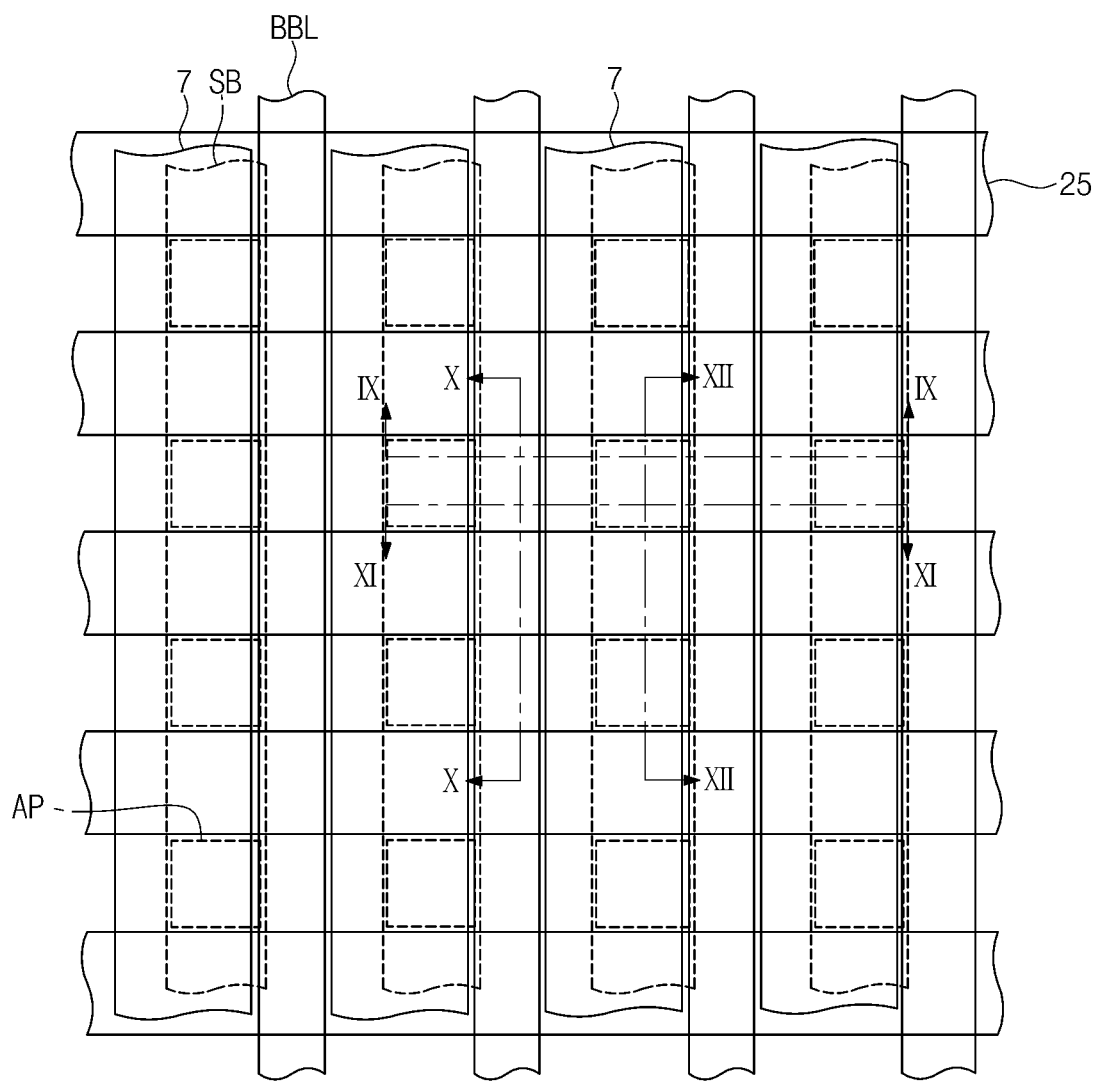
Figure 8F:
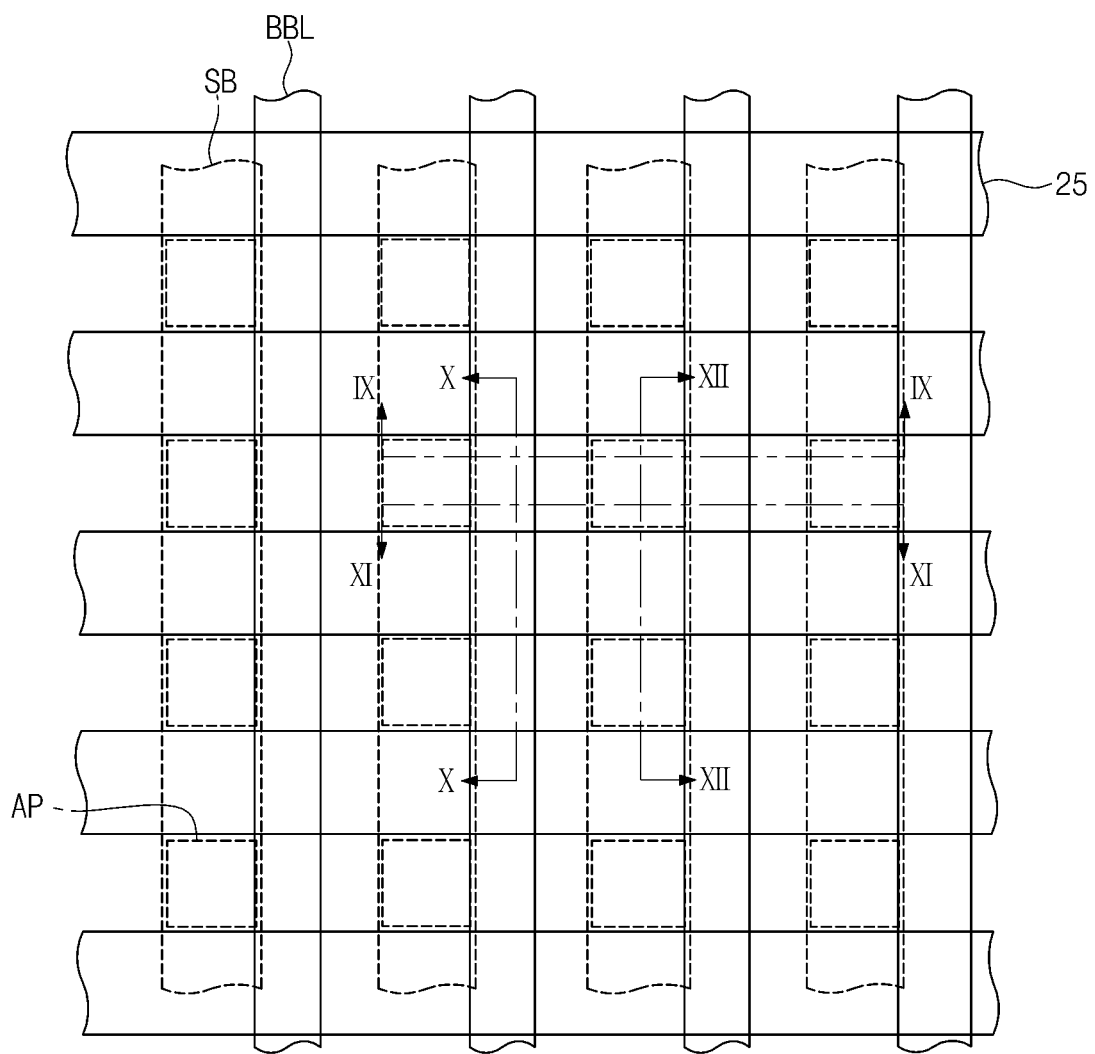
Figure 8G:
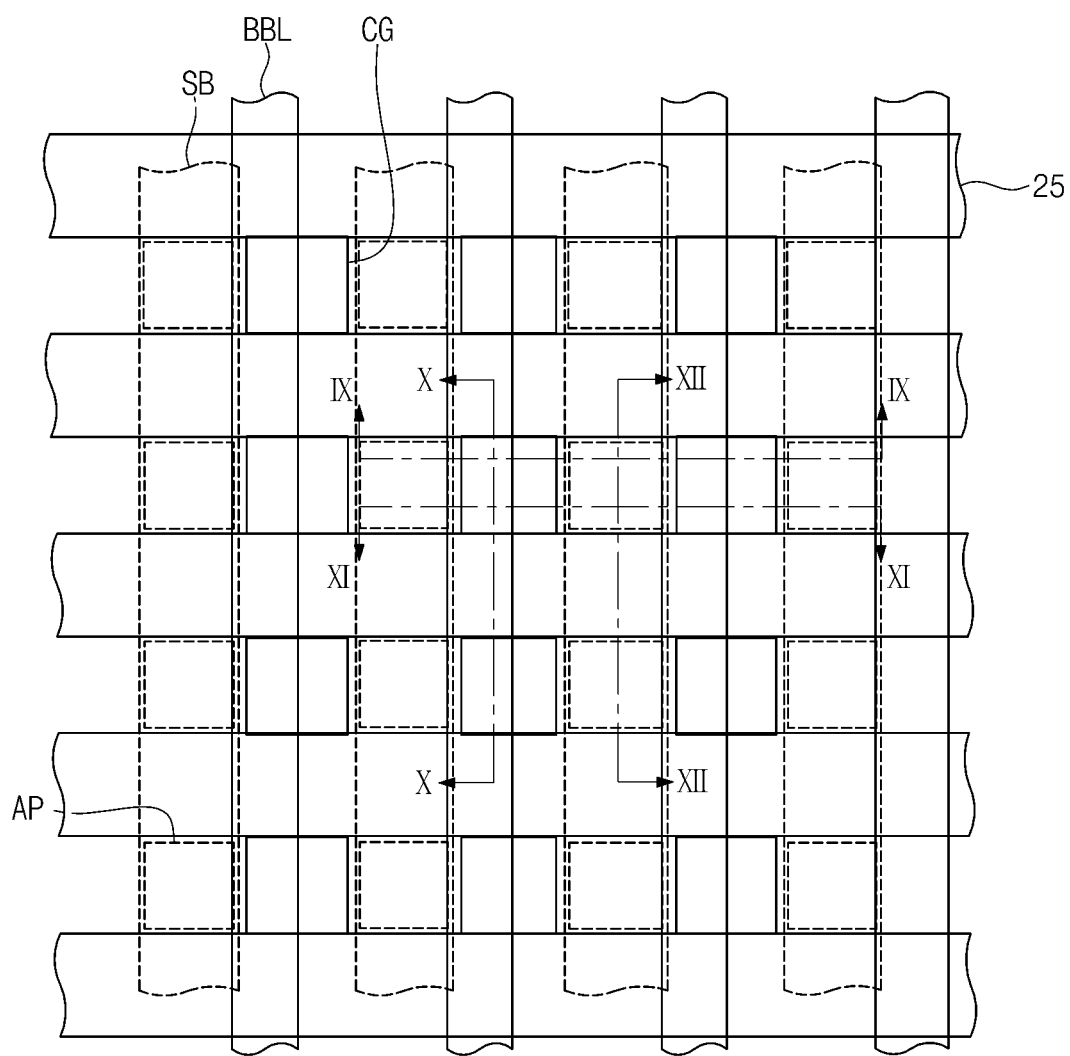
Figure 9A:
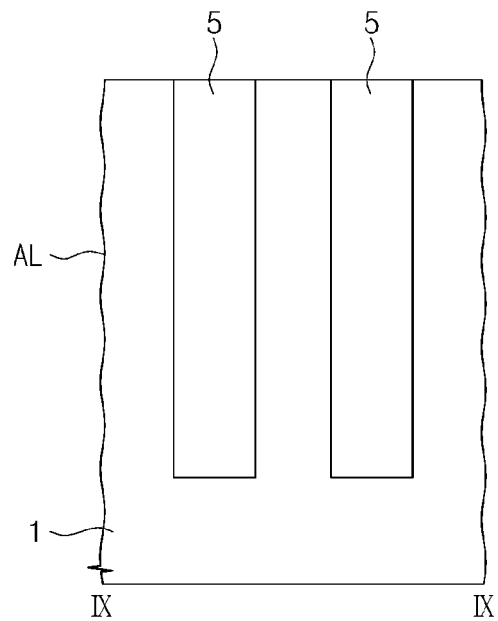
Figure 9B:
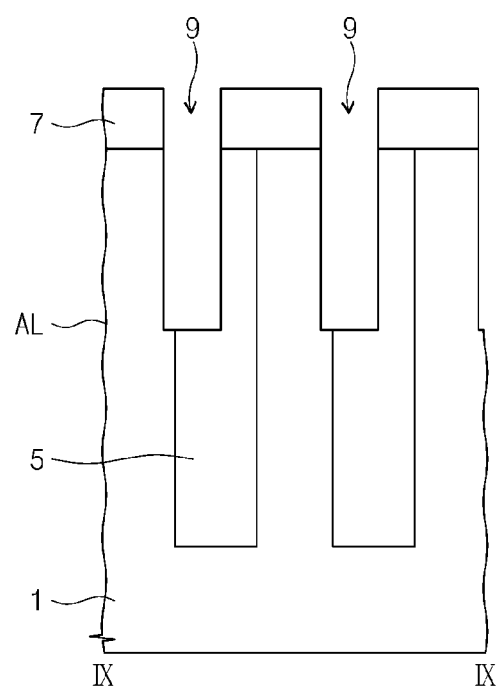
Figure 9C:
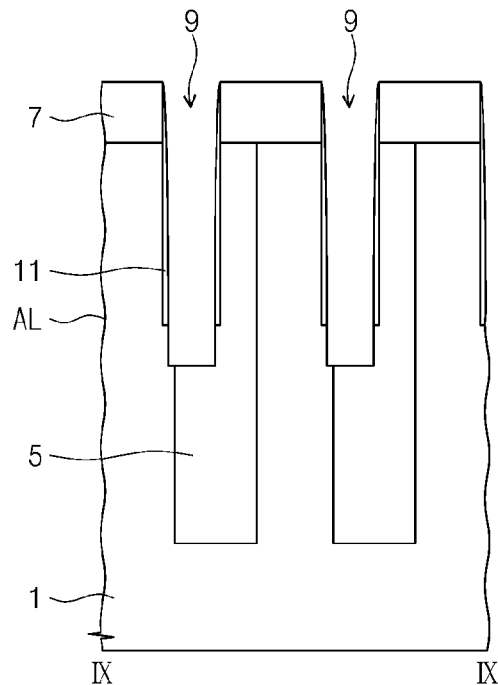
Figure 9D:
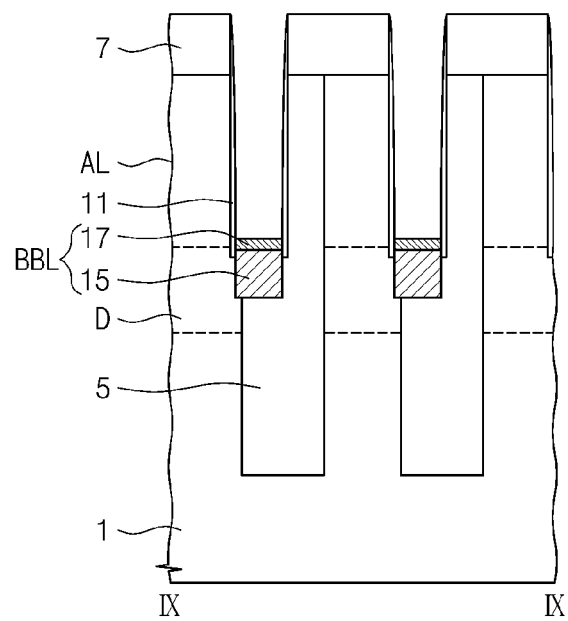
Figure 9E:
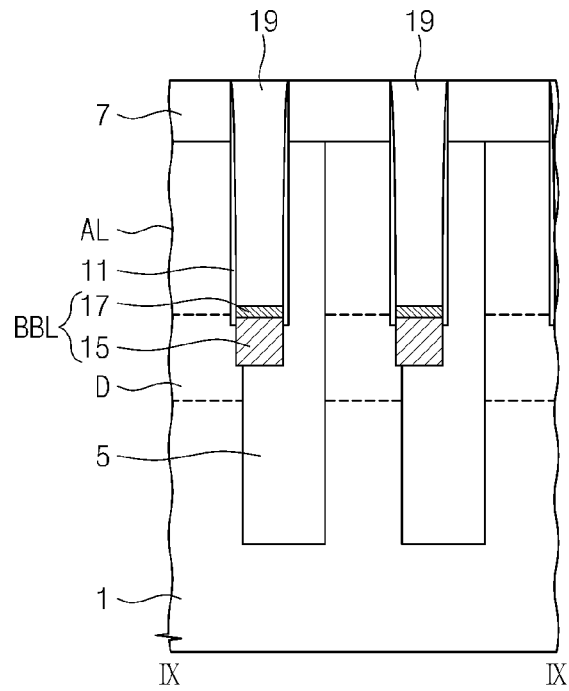
Figure 9F:
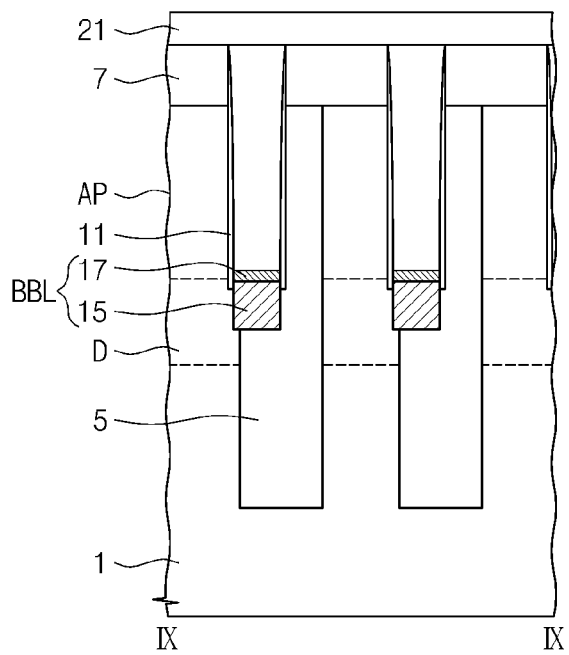
Figure 9G:
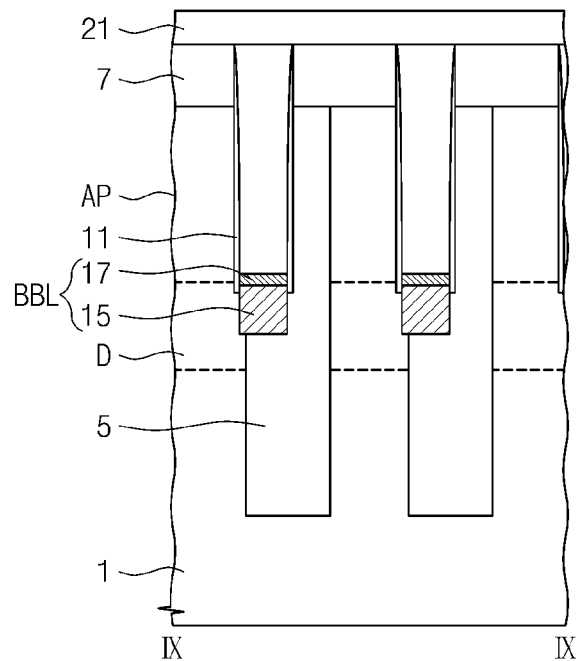
Figure 9H:
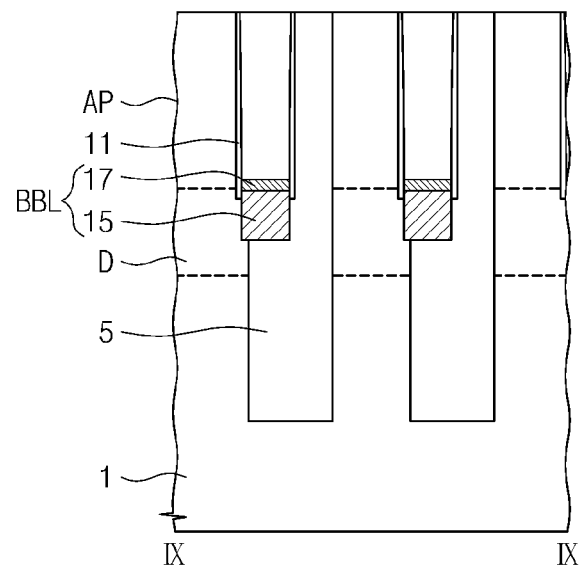
Figure 9I:
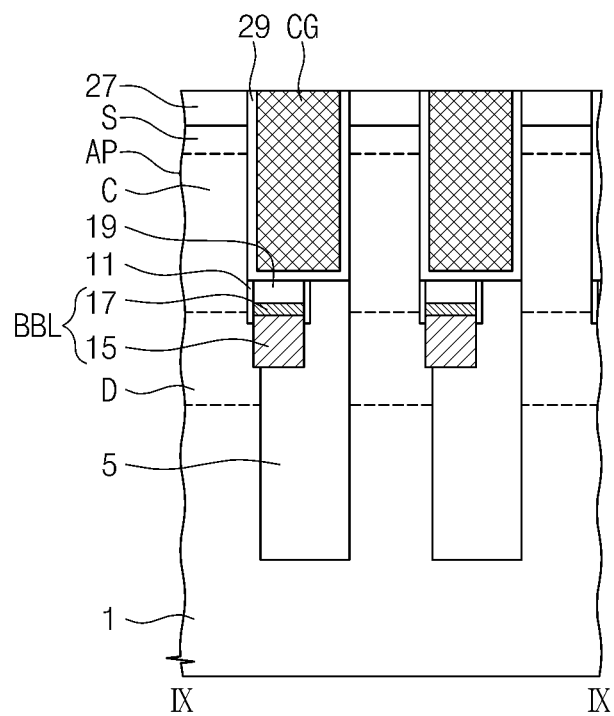
Figure 10A:
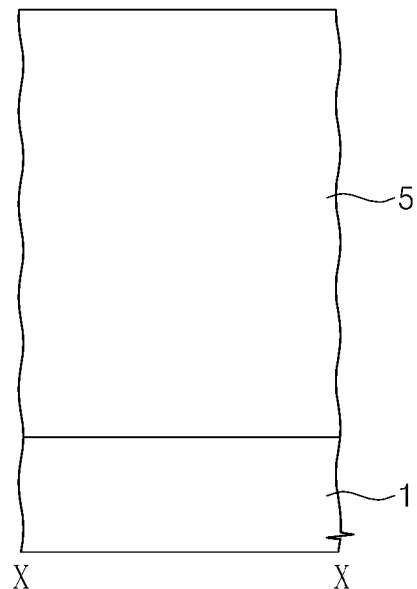
Figure 10B:
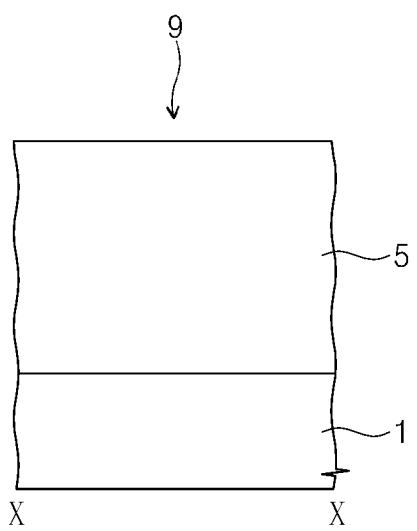
Figure 10C:
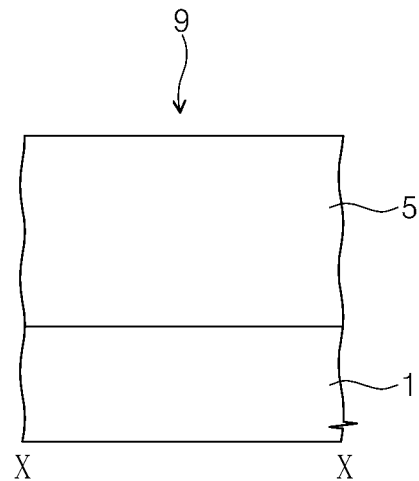
Figure 10D:
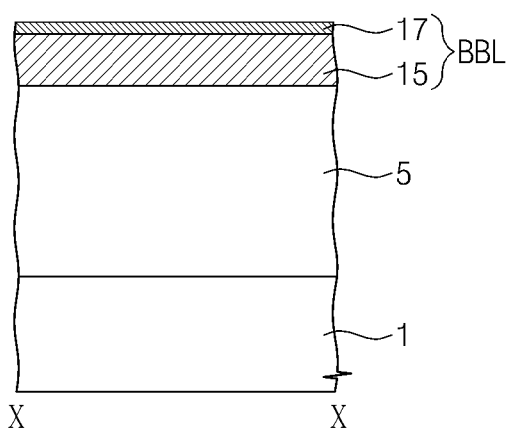
Figure 10E:
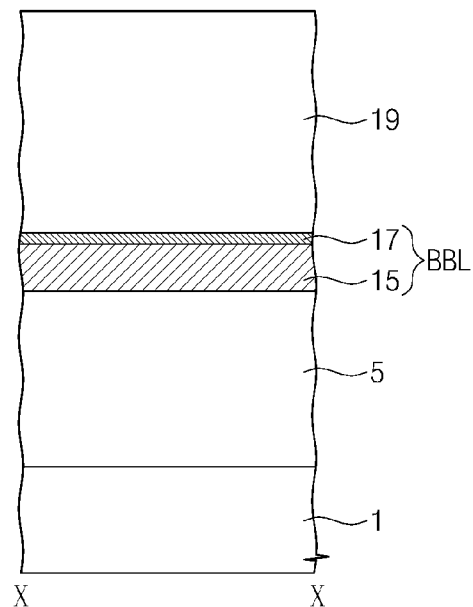
Figure 10F:
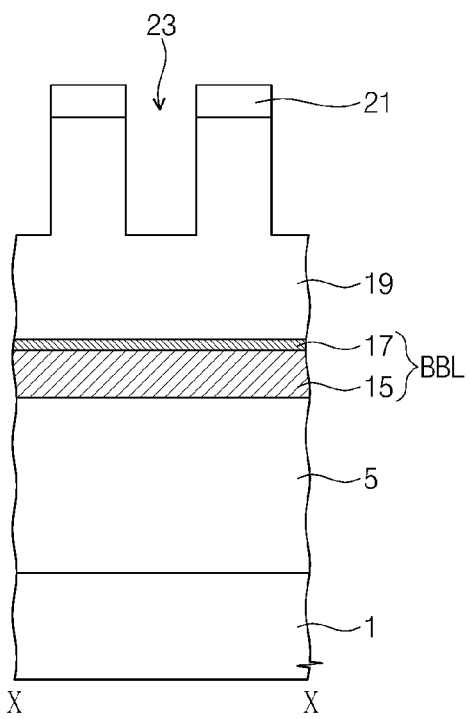
Figure 10G:
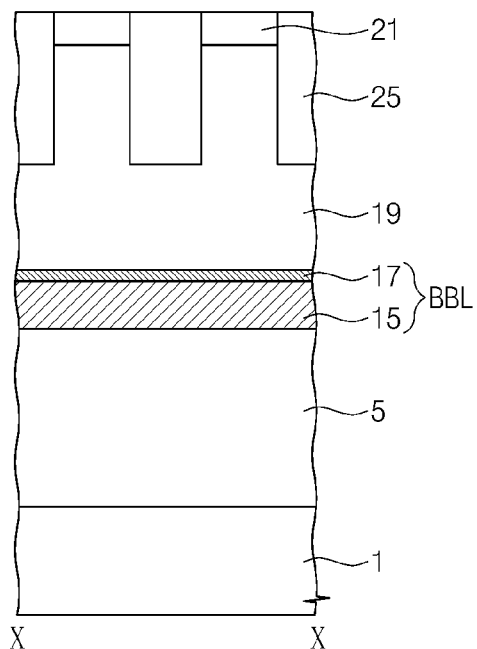
Figure 10H:
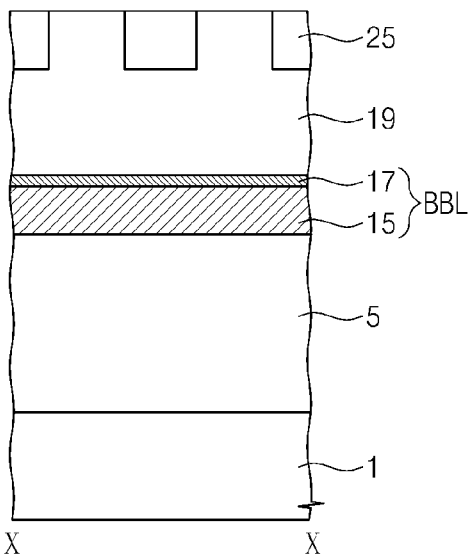
Figure 10I:
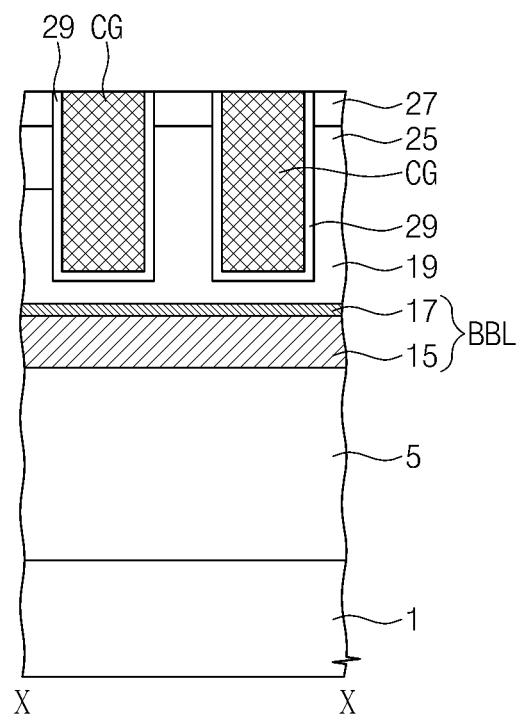
Figure 11A:
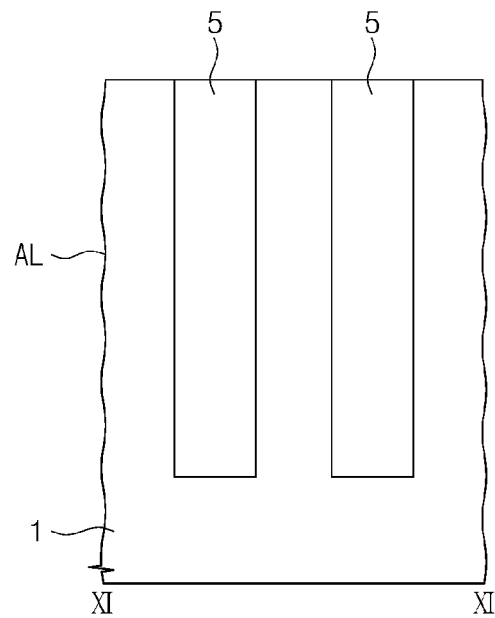
Figure 11B:
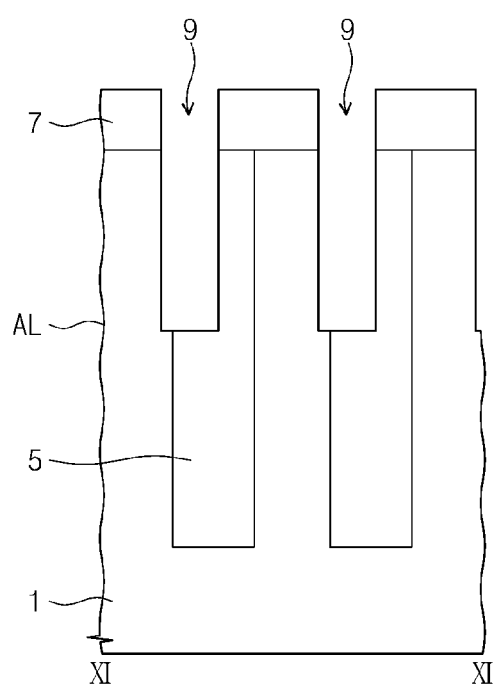
Figure 11C:
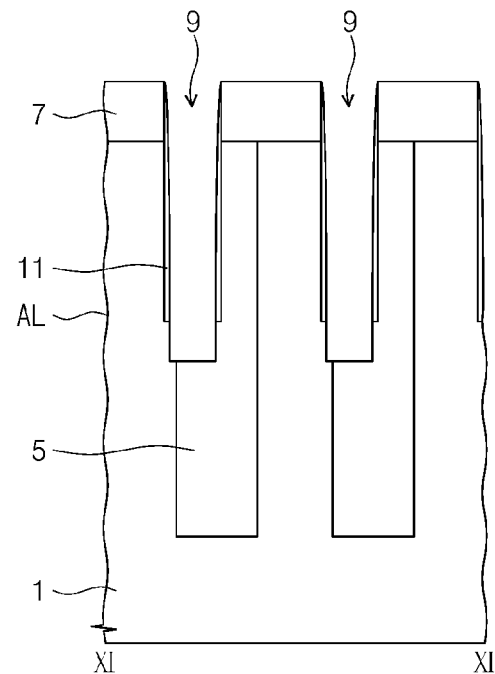
Figure 11D:
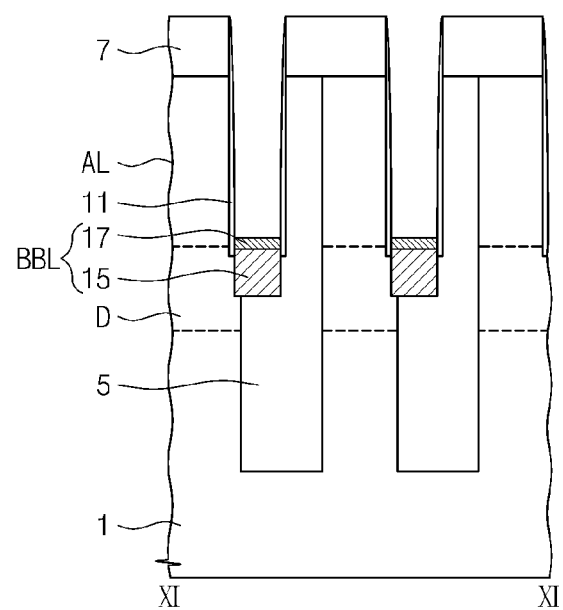
Figure 11E:
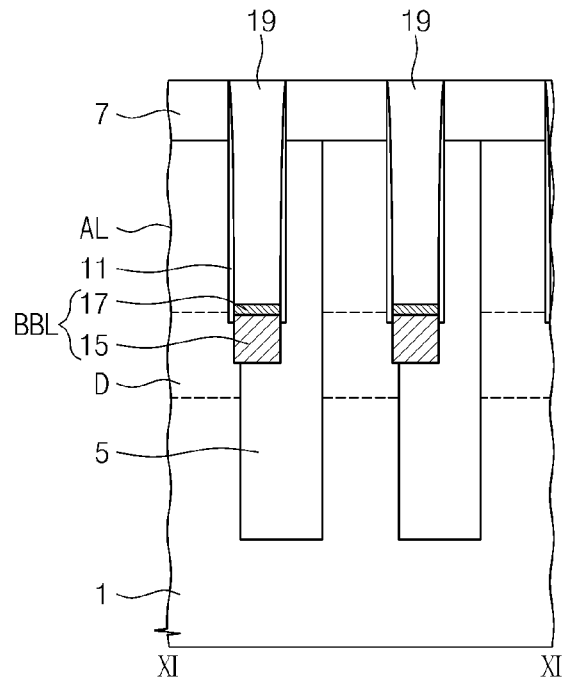
Figure 11F:
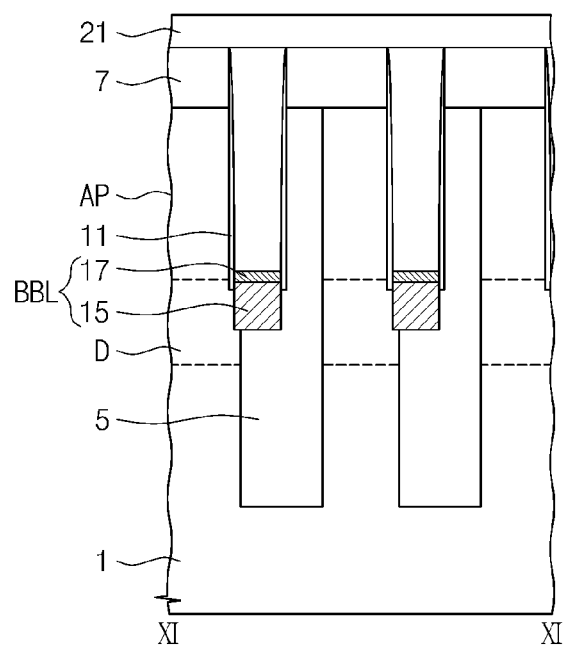
Figure 11G:
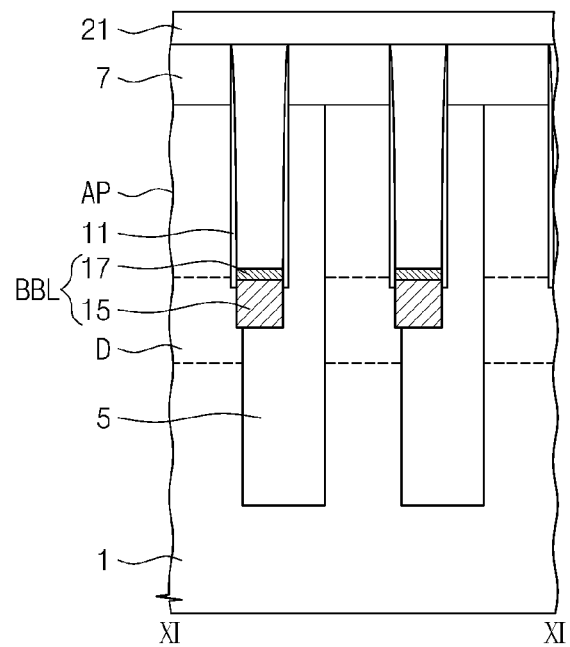
Figure 11H:
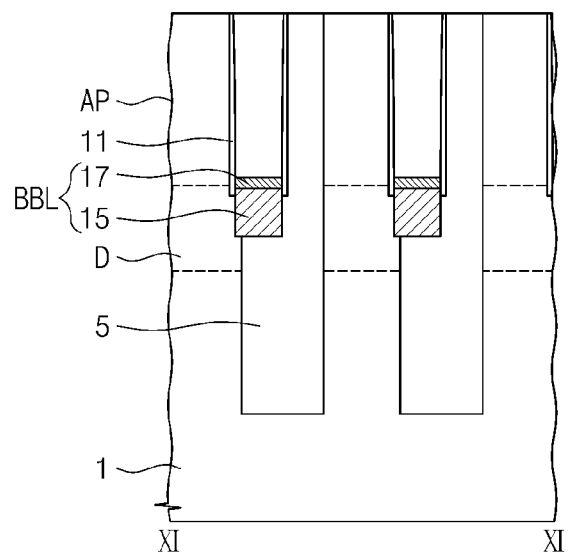
Figure 11I:
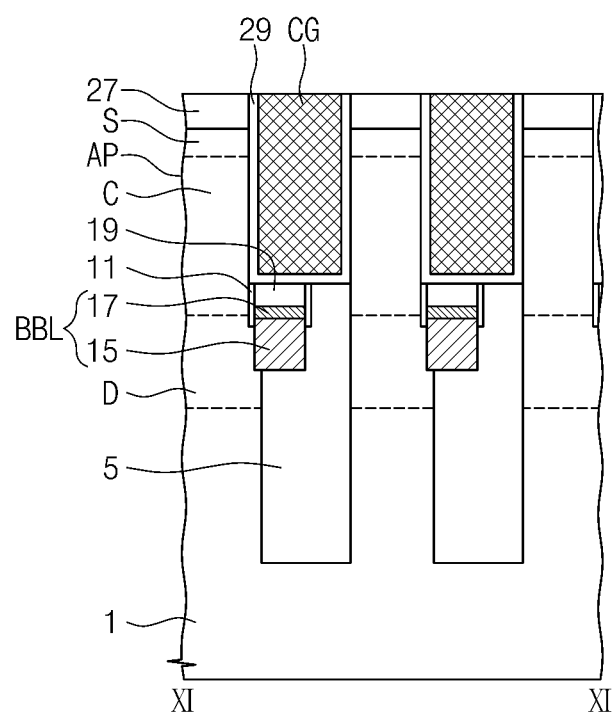
Figure 12A:
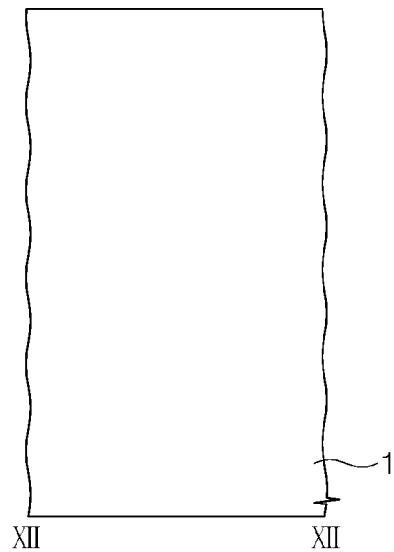
Figure 12B:
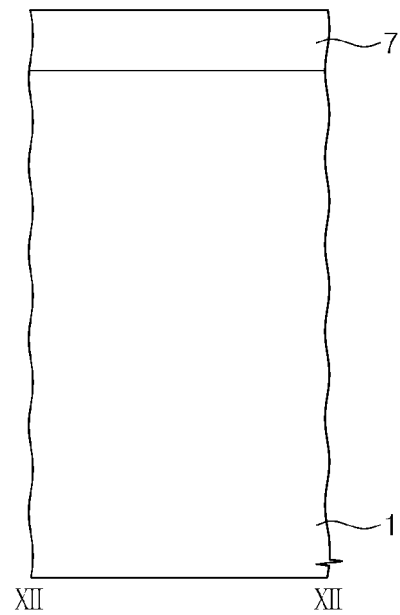
Figure 12C:
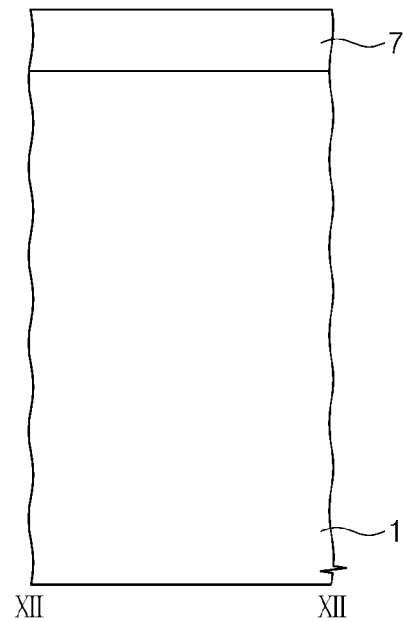
Figure 12D:
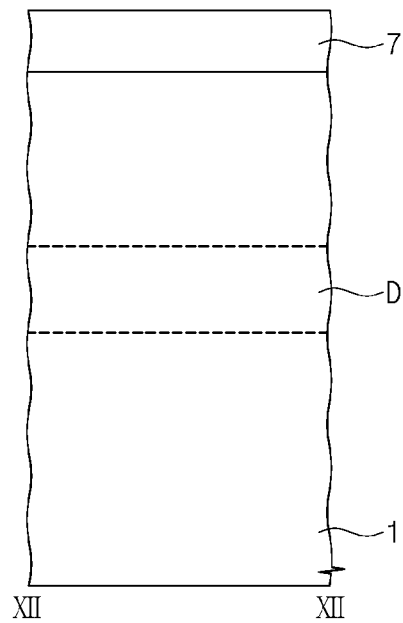
Figure 12E:
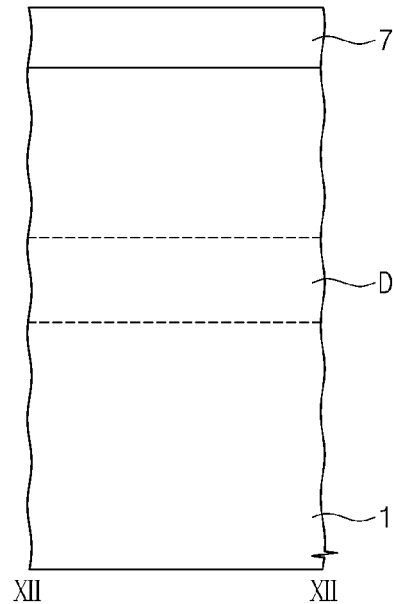
Figure 12F:
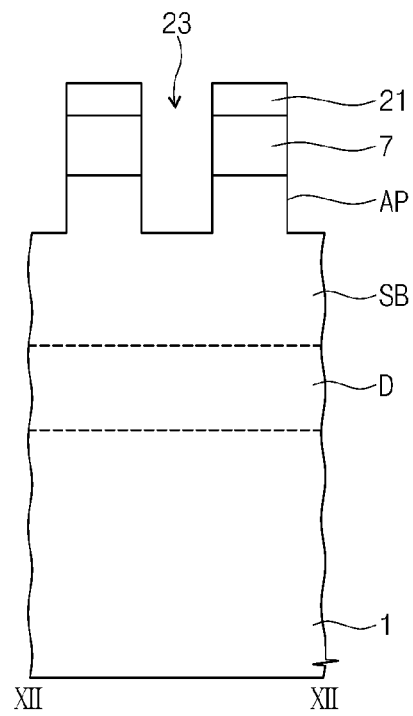
Figure 12G:
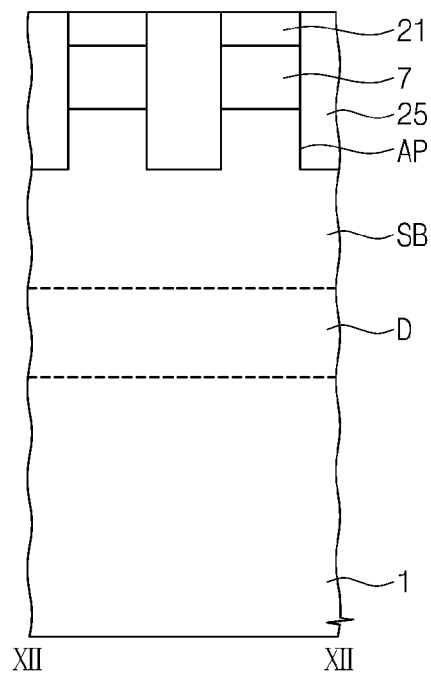
Figure 12H:
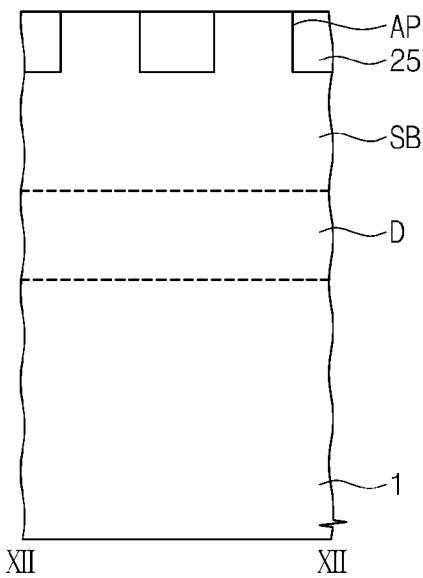
Figure 12I:
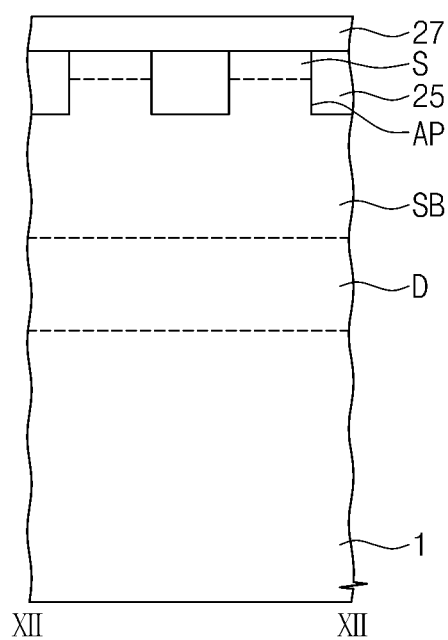

FIG. 2 is a plan view of a semiconductor device according to example embodiments of inventive concepts. FIGS. 3, 4, 5, and 6(a) are sectional views illustrating sections taken along lines III-III, IV-IV, V-V and VI-VI of FIG. 2, and FIG. 7 is a perspective view of a semiconductor device according to example embodiments of inventive concepts.

Referring to FIGS. 2 to 5, 6(a), and 7, a semiconductor device may include a plurality of active pillars AP, each of which is vertically extended from a substrate 1. The substrate 1 may include at least one semiconductor material (e.g., single crystalline silicon). In addition, the active pillars AP may include a portion of the at least one semiconductor material (e.g., single crystalline silicon), like the substrate 1. Each of the active pillars AP may include an upper doped region S, a lower doped region D, and a channel region C interposed between the upper and lower doped regions S and D. In example embodiments, the upper and lower doped regions S and D may be doped with impurities of the same conductivity type. For example, both of the upper and lower doped regions S and D may be highly doped with n-type dopants; that is, they may be n+ impurity regions). The channel region C may be doped with impurities having a different conductivity type from the upper doped region S. For example, the channel region C may be p-type. The substrate 1 may be doped to have the same conductivity type as the channel region C, but example embodiments are not limited thereto. Some of the lower doped regions D, which are arranged along a second direction Y, may be connected with each other to form a conductive pathway of line shape, but example embodiments of inventive concepts are not limited thereto. In this case, the lower doped regions D arranged along a first direction X may be space apart from each other by a device isolation layer 5.

Figure 3:
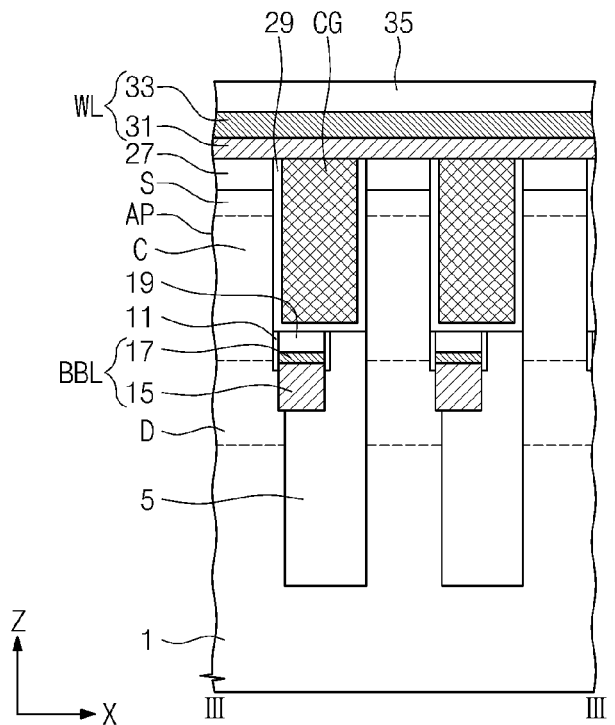

Word lines WL may be disposed on the active pillars AP to extend along the first direction X crossing the second direction Y. Each of the word lines WL may include a first word line layer 31 and a second word line layer 33 sequentially stacked on the active pillars AP. The first word line layer 31 may be, for example, formed of doped polysilicon, and the second word line layer 33 may be formed of a metallic layer. A capping layer 35 may be disposed on the word line WL, and spacers 37 may be formed on sidewalls of the word line WL. An upper insulating layer 27 may be interposed between the word line WL and top surfaces of the active pillars AP. A contact gate electrode CG may be disposed between adjacent ones of the active pillars AP and be connected to the word line WL. The contact gate electrode CG may be formed to have a plug or cylindrical shape. A gate insulating layer 29 may be interposed between the contact gate electrode CG and the active pillars AP. In example embodiments of inventive concepts, a sidewall of the word line WL may not be aligned with a sidewall of the contact gate electrode CG. The word line WL may expose a portion of a top surface of the contact gate electrode CG and a portion of a top surface of the active pillar AP. Referring to FIG. 3, a plurality of the contact gate electrodes CG may be connected to the corresponding one of the word lines WL to form a comb shape, in a sectional view taken along a line III-III.

Figure 4:
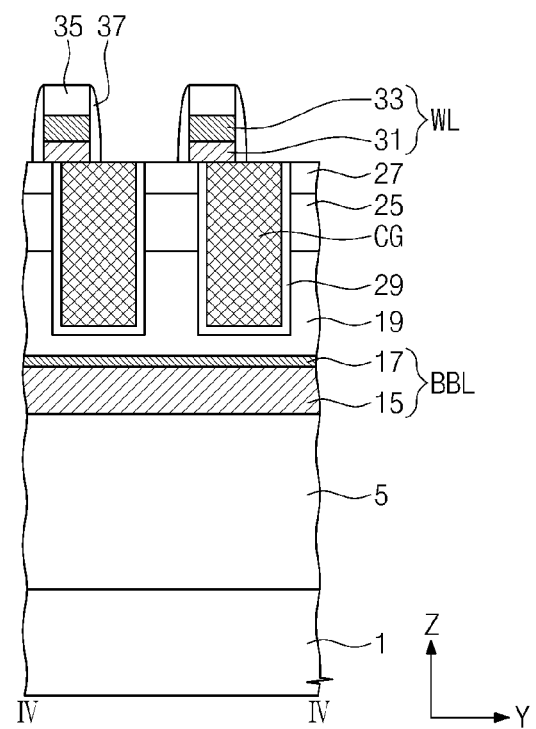
Figure 5:
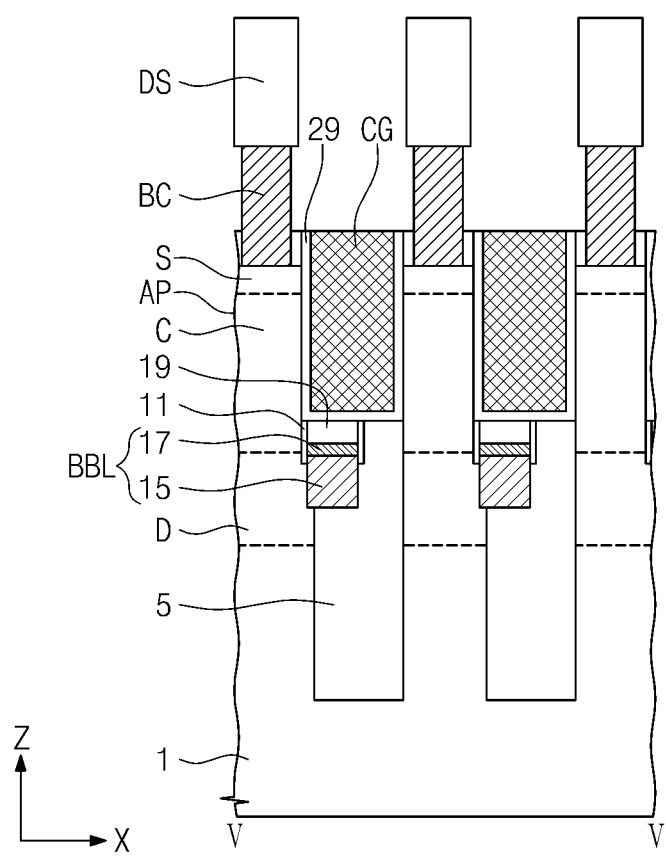

Buried bit lines BBL may be disposed below the contact gate electrodes CG to extend along the second direction Y. Each of the buried bit lines BBL may include a first bit line layer 15 and a second bit line layer 17 sequentially stacked on the substrate 1. The first bit line layer 15 may include a doped polysilicon layer, and the second bit line layer 17 may include a metallic layer. A portion of one side surface of the buried bit line BBL may be in contact with the lower doped region D, while a bottom surface and other side surface of the buried bit line BBL may be in contact with the device isolation layer 5. A first insulating gap-fill pattern 19 may be interposed between the buried bit line BBL and the contact gate electrode CG. In a sectional view taken along a line IV-IV and as shown in FIG. 4, the first insulating gap-fill pattern 19 may extend upward to be interposed between lower sidewalls of adjacent ones of the contact gate electrodes CG. The first insulating gap-fill pattern 19 may have a comb shape, in the sectional view taken along a line IV-IV and as shown in FIG. 4. An insulating gap-fill spacer 11 may be interposed between the first insulating gap-fill pattern 19 and the device isolation layer 5 and between the first insulating gap-fill pattern 19 and the lower doped region D.

Data storing elements DS may be electrically connected to the upper doped regions S, respectively, via data storing element contacts BC penetrating the upper insulating layer 27. The data storing elements DS may be realized using one of a capacitor, a magnetic tunnel junction (MTJ) pattern, or a variable resistance structure. For instance, in the case in which the data storing element DS is a capacitor, the data storing element DS may include a lower electrode, an upper electrode, and a dielectric interposed therebetween.

In example embodiments of inventive concepts, lower portions of the channel regions C of the active pillars AP disposed adjacent to each other may be connected with each other by a string body connection portion SB. The string body connection portion SB may be doped with impurities having the same conductivity type as the channel region C. A top surface of the string body connection portion SB may be lower than a bottom surface of the upper doped region S. The string body connection portion SB may extend along the second direction Y. A second insulating gap-fill pattern 25 may be provided between the string body connection portion SB and the upper insulating layer 27. The second insulating gap-fill pattern 25 may have a line shape extending along the first direction X. In example embodiments, the channel regions C may be connected in parallel to the string body connection portion SB to form a comb shape, in the sectional view taken along a line VI-VI of FIG. 2 and as shown in FIG. 6(a). The string body connection portion SB may be used as a pathway for an extraction of accumulated holes from the channel region C. In other words, the semiconductor device according to example embodiments of inventive concepts, since the channel regions C of the active pillars AP are connected with each other through the string body connection portion SB, it is possible to limit (and/or prevent) the channel regions C from being electrically floated. This enables to overcome technical problems (such as, a leakage current and/or a deterioration of data retention property) related to the floating of the channel regions C. The string body connection portions SB may include a semiconductor material (e.g., single crystalline silicon), like the substrate 1.

Figure 6B:
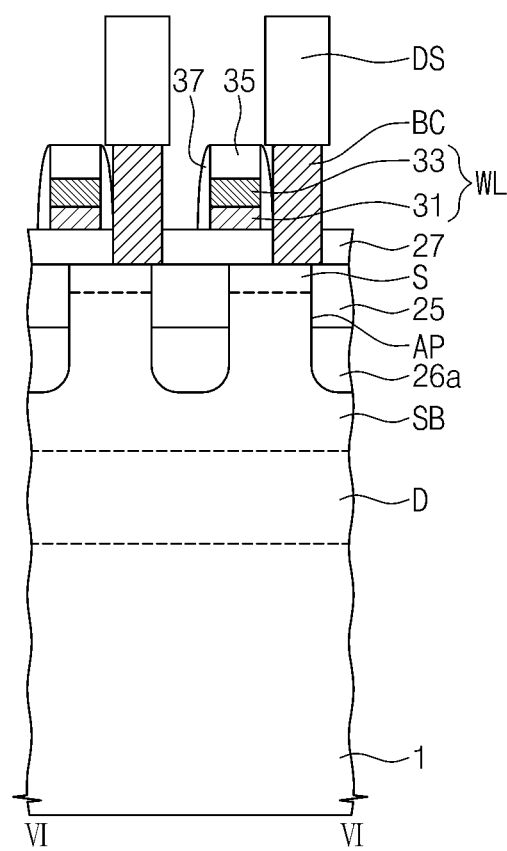
FIGS. 6(b) through 6(d) show semiconductor devices according to example embodiments of inventive concepts and are sectional views taken along a portion corresponding to a line VI-VI' of FIG. 2.
Figure 6C:
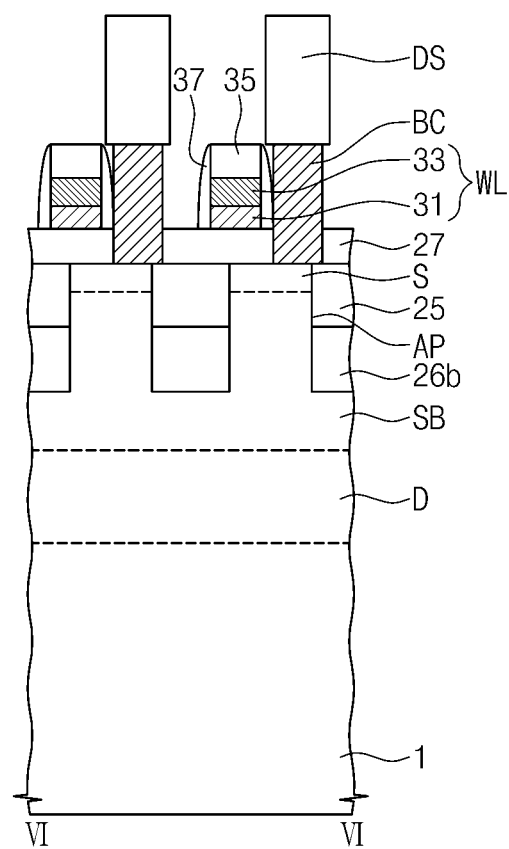
Figure 6D:
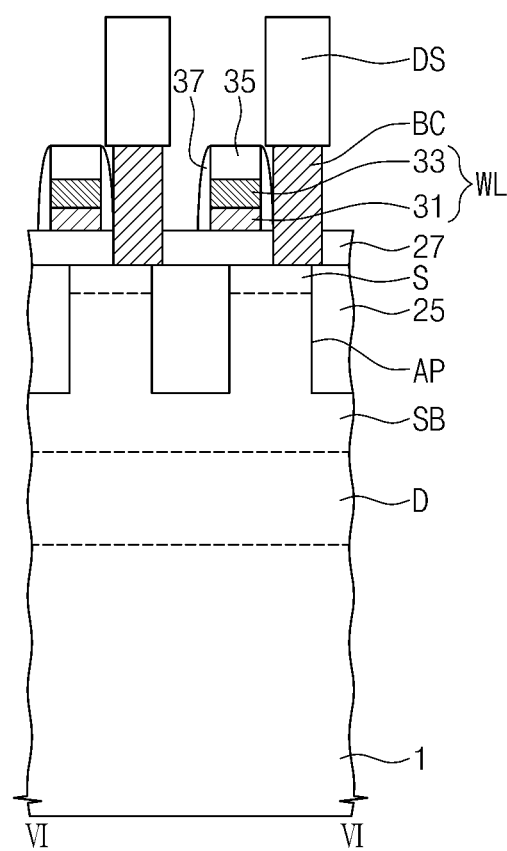

FIGS. 6(b) through 6(d) show semiconductor devices according to example embodiments of inventive concepts and are sectional views taken along a portion corresponding to a line VI-VI of FIG. 2.

Referring to FIG. 6(b), the string body connection portion SB may further include a separation doped region 26a disposed below the second insulating gap-fill pattern 25. In example embodiments, the separation doped region 26a may be in contact with a bottom surface of the second insulating gap-fill pattern 25 and be spaced apart from the lower doped region D. The separation doped region 26a may have the same conductivity type as the channel region C and an impurity concentration higher than the channel region C.

Referring to FIG. 6(c), an auxiliary insulating gap-fill pattern 26b may be interposed between the second insulating gap-fill pattern 25 and the string body connection portion SB. A top surface of the string body connection portion SB may be lower than that of FIG. 6(a).

Referring to FIG. 6(d), a bottom surface of the second insulating gap-fill pattern 25 may be lower compared with that of FIG. 6(a). For example, the string body connection portion SB may have a vertical thickness of less than half a vertical thickness of the active pillar AP.

FIGS. 13A through 13C are schematic diagrams illustrating electric connections between string body connection portions and voltage generators according to example embodiments of inventive concepts.

Referring to FIGS. 13A through 13C, the semiconductor device may further include a voltage generator 100 electrically connected to the string body connection portions SB. The string body connection portions SB may be arranged to be parallel to each other. The voltage generator 100 may be configured to apply a voltage to the string body connection portions SB. In example embodiments of inventive concepts, the same voltage as that applied to the substrate 1 may be applied to the string body connection portions SB by the voltage generator 100.

According to example embodiments of inventive concepts, as shown in FIG. 13A, the voltage generator 100 may include a first voltage generator 101 and a second voltage generator 102. The first voltage generator 101 may be connected to odd-numbered ones of the string body connection portions SB, and the second voltage generator 102 may be connected to even-numbered ones of the string body connection portions SB. The first and second voltage generators 101 and 102 may be configured to generate the same voltage (or substantially the same voltage) and apply the voltage to the string body connection portions SB.

According to example embodiments of inventive concepts, as shown in FIG. 13B, the voltage generator 100 may be uniquely disposed at one side of the string body connection portions SB, and all of the string body connection portions SB disposed within a specific region may be coupled to the voltage generator 100. Here, end portions of the string body connection portions SB opposite to the voltage generator 100 may be opened.

According to example embodiments of inventive concepts, as shown in FIG. 13C, end portions of the string body connection portions SB opposite to the voltage generator 100 may be partially or overall connected with each other.

The semiconductor device may be a DRAM adopting a capacitor as the data storing element DS. In this case, the semiconductor device may be operated on the basis of a voltage condition given by the following Table 1.

TABLE 1

|  | Read | Write '0' | Write '1' | Stand-by |
| --- | --- | --- | --- | --- |
| selected WL | 3 V | 3 V | 3 V | −0.25 V |
| selected BBL | 1.5 V or 0 V | 0 V | 1.5 V | 0.75 V |
| SB | −0.5 V | −0.5 V | −0.5 V | −0.5 V |
| substrate | −0.5 V | .5 V | .5 V | .5 V |
| upper electrode | 1.5 V | 1.5 V | 1.5 V | 1.5 V |
| unselected WL | −0.25 V | −0.25 V | −0.25 V | −0.25 V |
| unselected BBL | 0.75 V | 0.75 V | 0.75 V | 0.75 V |

Hereinafter, a method of fabricating the semiconductor device will be described with reference to FIGS. 8(a) to (g), 9(a) to 12(a), 9(b) to 12(b), 9(c) to 12(c), 9(d) to 12(d), 9(e) to 12(e), 9(f) to 12(f), 9(g) to 12(g), 9(h) to 12(h), and 9(i) to 12(i), which are sectional views illustrating a method of fabricating the semiconductor device of FIGS. 3, 4, 5, and 6(a).

Referring to FIGS. 8(a) and 9(a) to 12(a), a device isolation layer 5 may be formed in a substrate 1 to define active lines AL. The device isolation layer 5 may have a plurality of linear portions, each of which is parallel to a second direction Y. The device isolation layer 5 may be formed using the shallow trench isolation (STI) technique.

Referring to FIGS. 8(b) and 9(b) to 12(b), first mask patterns 7 may be formed on the substrate 1. Each of the first mask patterns 7 may be formed to have a line shape, which may be partially overlapped with the device isolation layer 5 and partially expose a top surface of the active line AL. The device isolation layer 5 may be etched using the first mask pattern 7 as an etch mask. As a result, first trenches 9 may be formed in the device isolation layer 5 to expose sidewalls of the active lines AL. In example embodiments of inventive concepts, the sidewall of the active line AL may be partially etched during the formation of the first trenches 9.

Referring to FIGS. 9(c) to 12(c), insulating gap-fill spacers 11 may be formed to cover sidewalls of the first trenches 9. The insulating gap-fill spacers 11 may be, for example, formed of silicon nitride. The device isolation layer 5 may be etched using the first mask pattern 7 and the insulating gap-fill spacer 11 as an etch mask. As a result, a sidewall of the active line AL may be exposed under the insulating gap-fill spacer 11.

Referring to FIGS. 8(d) and 9(d) to 12(d), lower doped regions D may be formed in the exposed sidewall of the active line AL by performing, for instance, an ion implantation process. Thereafter, buried bit lines BBL may be formed in bottom surfaces of the first trenches 9. In example embodiments, each of the buried bit lines BBL may include a first bit line layer 15 and a second bit line layer 17. The first bit line layer 15 may be formed of doped polysilicon, and the second bit line layer 17 may be formed of a metallic layer (e.g., of metal silicide). The formation of the buried bit lines BBL may include forming the first bit line layer 15 of doped polysilicon to fill the first trench 9, recessing the first bit line layer 15 to remain at a bottom of the first trench 9, forming a metal layer to fill the first trench 9 provided with the recessed first bit line layer 15, and then, performing a silicidation process to form the buried bit lines BBL. After the silicidation process, the remaining metal layer may be removed from the first trench 9. In example embodiments, the formation of the lower doped region D may include forming the first bit line layer 15 to have a high impurity concentration, and then thermally treating the resulting structure. In this case, impurities contained in the first bit line layer 15 may be diffused into the active line AL to form the lower doped region D.

Referring to FIGS. 9(e) to 12(e), a first insulating gap-fill pattern 19 filling the first trench 9 may be formed by, for example, forming a first insulating gap-fill layer to fill the first trench 9 and then planarizing it to expose the first mask patterns 7.

Referring to FIGS. 8(d) and 9(f) to 12(f), second mask patterns 21 may be formed on the substrate 1. Each of the second mask patterns 21 may extend linearly along the first direction X. The second mask patterns 21 may be used to delimit positions of active pillars AP, which will be formed in a subsequent process, and be formed to cross over the active line AL or the device isolation layer 5. Second trenches 23 may be formed by etching the first insulating gap-fill pattern 19, the first mask pattern 7, and the active line AL using the second mask pattern 21 as an etch-mask. A bottom surface of the second trench 23 may be vertically spaced apart from a top surface of the buried bit line BBL. Due to the formation of the second trenches 23, the active line AL may be patterned to form active pillars AP and a string body connection portion SB.

Referring to FIGS. 8(e) and 9(g) to 12(g), second insulating gap-fill patterns 25 may be formed to fill the second trenches 23, respectively. Each of the second insulating gap-fill patterns 25 may extend linearly along the first direction X.

Referring to FIGS. 8(f) and 9(h) to 12(h), the top surface of the active pillar AP may be exposed by a planarization process removing the first mask pattern 7, the second mask pattern 21, a portion of the first insulating gap-fill pattern 19, and a portion of the second insulating gap-fill pattern 25 that are located at a level higher than the active pillars AP.

Referring to FIGS. 8(g) and 9(i) to 12(i), an upper insulating layer 27 may be formed on the active pillars AP. Next, the device isolation layer 5, the first insulating gap-fill pattern 19 and the insulating gap-fill spacer 11, which are interposed between adjacent ones of the active pillars AP, may be etched to form contact holes. The contact holes may be formed to have bottom surfaces spaced apart from the top surface of the buried bit line BBL. In other words, the first insulating gap-fill pattern 19 and the insulating gap-fill spacer 11 may remain on the bottom surface of the contact holes. Subsequently, a gate insulating layer 29 may be formed to cover bottom and side surfaces of each contact hole, and a contact gate electrode CG may be formed by forming a conductive layer to fill the contact holes and planarizing the conductive layer to expose the upper insulating layer 27.

Referring back to FIGS. 2 to 5, and 6(a), a plurality of word lines WL may be formed on the substrate 1 to be parallel to the first direction. The formation of the word lines WL may include sequentially stacking a first word line layer 31, a second word line layer 33, and a capping layer 35 on the substrate 1, and patterning them to form the word lines WL. The word lines WL may be formed to be in direct and partially contact with top surfaces of the contact gate electrodes CG. For example, the word lines WL may expose partially the top surfaces of the contact gate electrodes CG as well as a top surface of the upper insulating layer 27. Spacers 37 may be formed on sidewalls of the word lines WL. Thereafter, an interlayer dielectric (not shown) may be formed to cover the word lines WL, and data storing element contacts BC may be connected to the top surfaces of the active pillars AP, respectively, through and the interlayer dielectric and the upper insulating layer 27. Next, data storing elements DS may be formed on the data storing element contacts BC, respectively.

Figure 14:
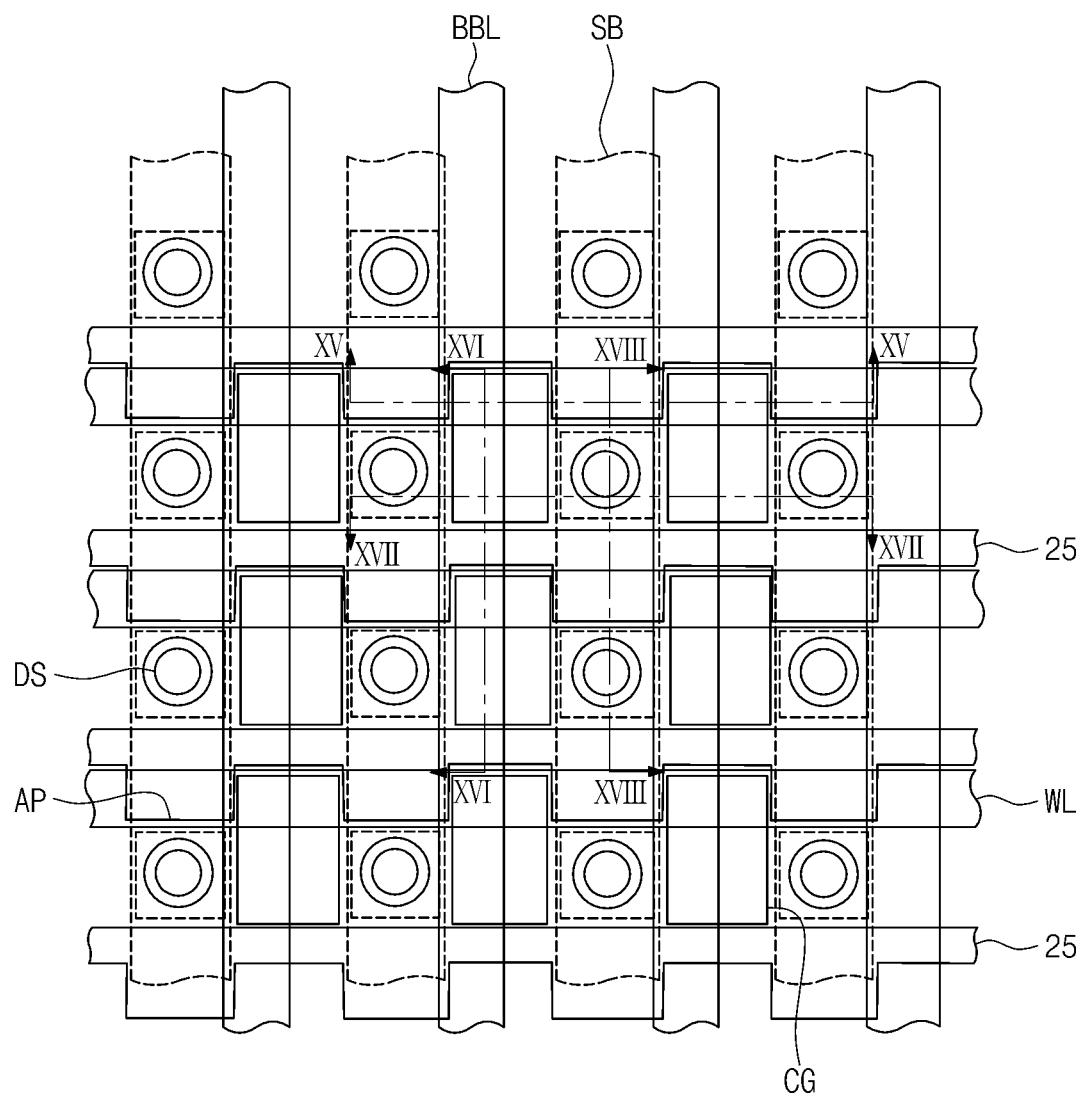
FIG. 14 is a plan view of a semiconductor device according to example embodiments of inventive concepts.
Figure 15:
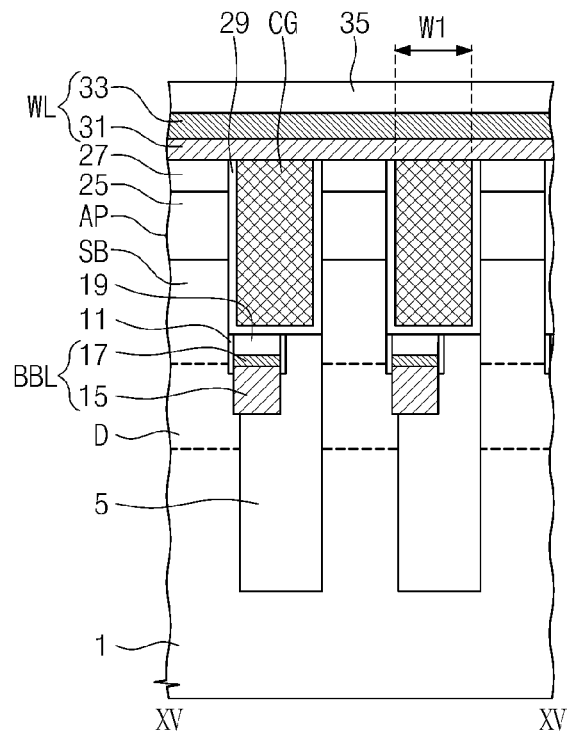
FIGS. 15, 16, 17, and 18 are sectional views illustrating sections taken along lines XV-XV, XVI-XVI, XVII-XVII, and XVIII-XVIII of FIG. 14.
Figure 16:
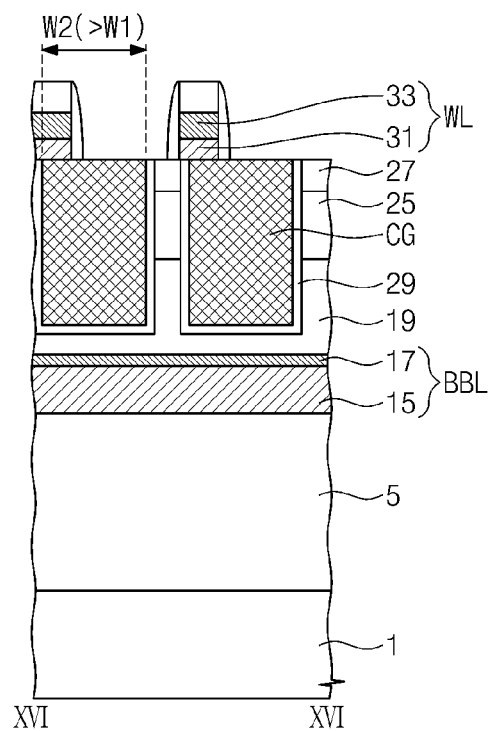
Figure 17:
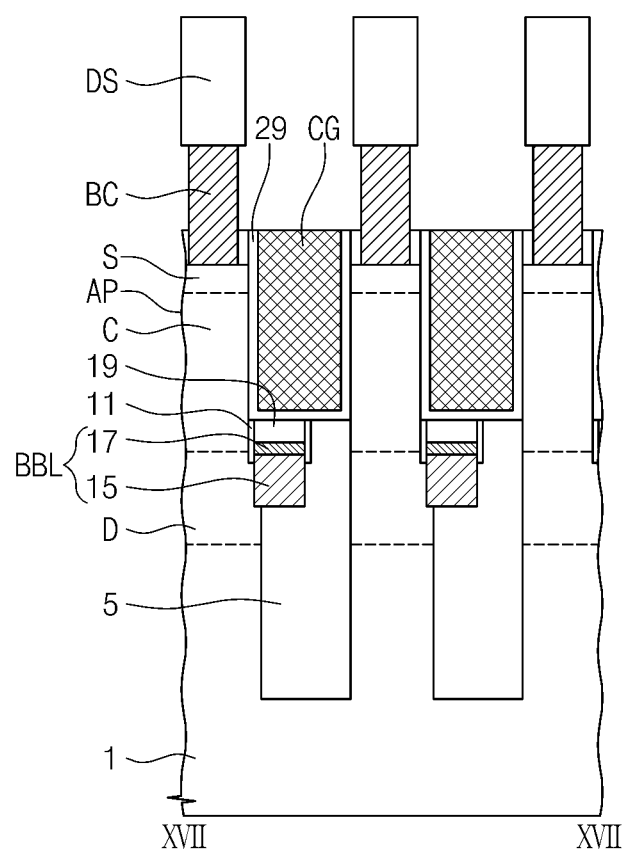
Figure 18:
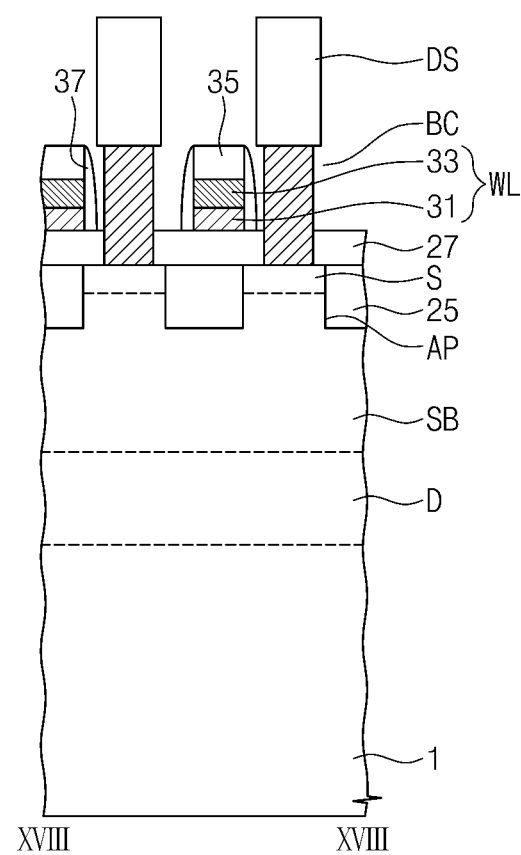

FIG. 14 is a plan view of a semiconductor device according to example embodiments of inventive concepts, and FIGS. 15, 16, 17, and 18 are sectional views taken along lines XV-XV, XVI-XVI, XVII-XVII, and XVIII-XVIII of FIG. 14.

Referring to FIGS. 14 to 18, a width W1 of the contact gate electrode CG, which is measured along the direction parallel to the word line WL, may be smaller than a width W2 thereof measured along the direction parallel to the buried bit line BL. The word line WL may not be overlapped with the active pillars AP, in plan view. This enables to increase a contact area between the data storing element contact BC and the active pillar AP. The second insulating gap-fill pattern 25 may be shaped like a comb, in plan view as shown in FIG. 14.

The semiconductor device shown in FIGS. 14 to 18 may be configured to have the same technical features as the semiconductor device described with reference to FIG. 2 through 5, 6(a), 6(b) and 6(c), except for the aforementioned geometrical structures of the contact gate electrode CG, The word line WL, and the second insulating gap-fill pattern 25.

Applications of Example Embodiments

The semiconductor memory devices according to example embodiments of inventive concepts may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package according to example embodiments of inventive concepts may further include at least one semiconductor device (e.g., a controller and/or a logic device) that controls the semiconductor memory device.

Figure 19:
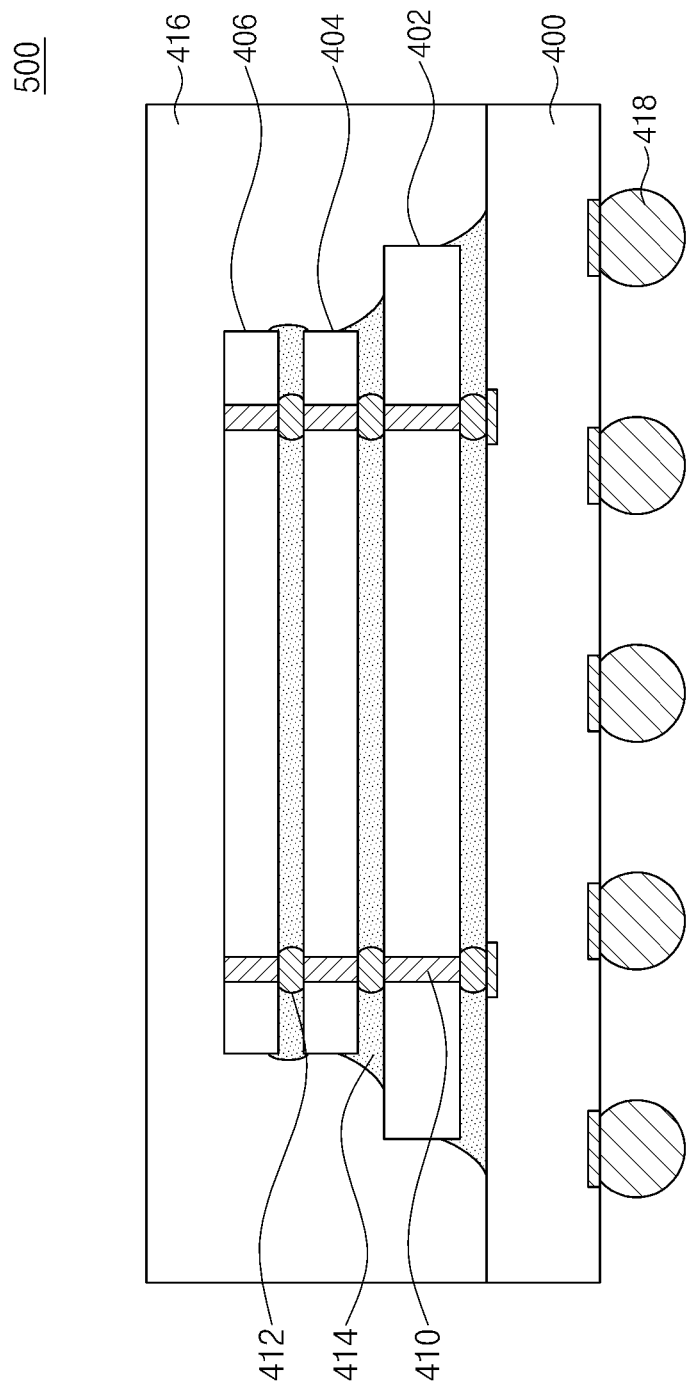
FIG. 19 is a sectional view schematically illustrating semiconductor packages including a semiconductor device according to example embodiments of inventive concepts.

FIG. 19 is a sectional view schematically illustrating semiconductor packages including a semiconductor device according to example embodiments of inventive concepts.

Referring to FIG. 19, a semiconductor package 500 may include a plurality of semiconductor chips stacked on a package substrate 400. For example, a first semiconductor chip 402, a second semiconductor chip 404 and a third semiconductor chip 406 may be stacked on the package substrate 400. In example embodiments, the second and third semiconductor chips 404 and 406 may be memory chips, which are of the same type as or a different type from each other. For example, the second and third semiconductor chips 404 and 406 may include the semiconductor device described above. The first semiconductor chip 402 may be a logic chip or an interposer. The logic chip may include a controller controlling the semiconductor device and/or a logic circuit. The first to third semiconductor chips 402, 404 and 406 may include a through via 410. Internal bumps 412 and a protection layer 414 may be interposed between the first to third semiconductor chips 402, 404 and 406 and between the first semiconductor chip 402 and the package substrate 400. The package substrate 400 and the first to third semiconductor chips 402, 404 and 406 may be covered with a molding layer 416. External bumps 418 may be attached on a bottom surface of the package substrate 400. In example embodiments of inventive concepts, solder balls may be used as the internal and/or external bumps 412 and 418.

Figure 20:
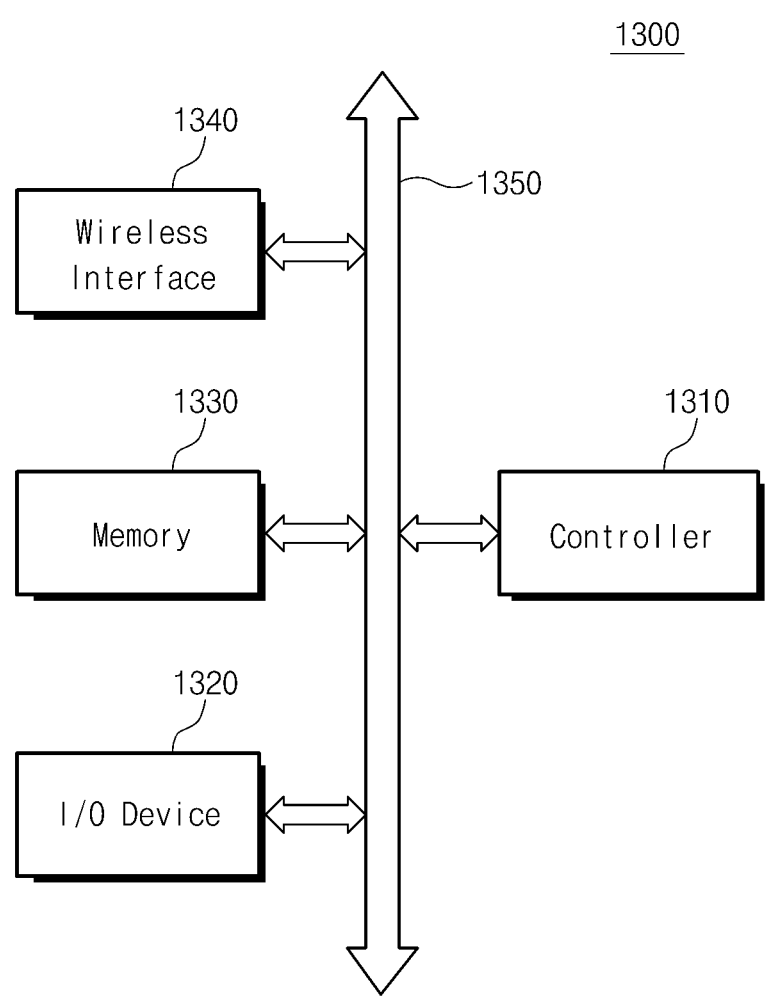
FIG. 20 is a block diagram schematically illustrating electronic devices including a semiconductor device according to example embodiments of inventive concepts.
Figure 21:
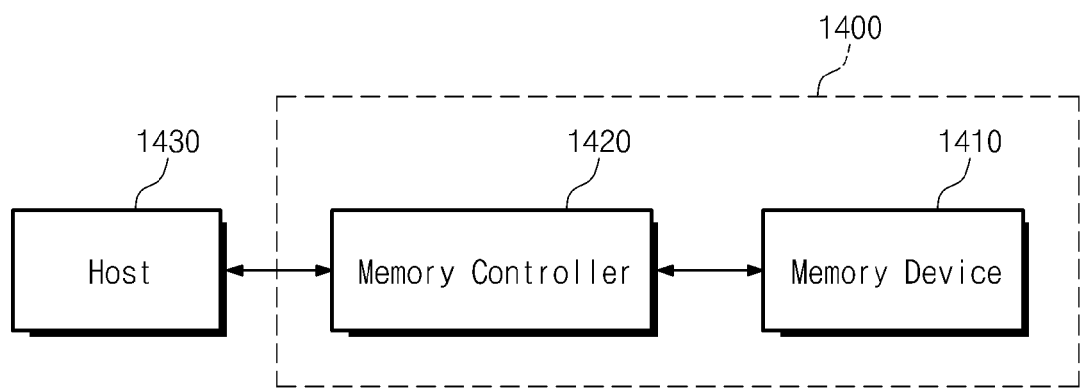
FIG. 21 is a block diagram schematically illustrating memory systems including a semiconductor device according to example embodiments of inventive concepts.

FIGS. 20 and 21 are block diagrams schematically illustrating electronic devices including a semiconductor device according to example embodiments of inventive concepts.

Referring to FIG. 20, an electronic device 1300 including a semiconductor device according to example embodiments of inventive concepts may be used in one of a personal digital assistant (PDA), a laptop computer, a mobile computer, a web tablet, a wireless phone, a cell phone, a digital music player, a wire or wireless electronic device, or a complex electronic device including at least two ones thereof. The electronic device 1300 may include a controller 1310, an input/output device 1320 such as a keypad, a keyboard, a display, a memory 1330, and a wireless interface 1340 that are combined to each other through a bus 1350. The controller 1310 may include, for example, at least one microprocessor, a digital signal process, a microcontroller or the like. The memory 1330 may be configured to store a command code to be used by the controller 1310 or a user data. The memory 1330 may include a semiconductor device including a vertical channel transistor according to example embodiments of inventive concepts. The electronic device 1300 may use a wireless interface 1340 configured to transmit data to or receive data from a wireless communication network using a RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Referring to FIG. 21, a memory system including a semiconductor device according to example embodiments of inventive concepts will be described. The memory system 1400 may include a memory device 1410 for storing huge amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device including a vertical channel transistor according to example embodiments of inventive concepts.

According to example embodiments of inventive concepts, channel regions of active pillars may be connected with each other by a string body connection portion, and thus, it is possible to limit (and/or prevent) the channel region from being floated. The string body connection portion may be used as a pathway for an extraction of accumulated holes from the channel region. This enables to overcome technical problems (such as, a leakage current and/or a deterioration of data retention property) related to the floating of the channel regions.

While example embodiments of inventive concepts have been particularly shown and described, it will be understood by one of ordinary skill in the art that variations in form and detail may be made therein without departing from the spirit and scope of the attached claims.

What is claimed is:
1. A semiconductor device, comprising:
a device isolation layer including a plurality of first trenches recessed to a first depth in the device isolation layer;
a substrate including a plurality of device isolation trenches spaced apart from each other in the substrate and a plurality of second trenches spaced apart from each other in the substrate,
the device isolation layer in the plurality of device isolation trenches,
the plurality of second trenches crossing the plurality of device isolation trenches and the plurality of first trenches,
the plurality of second trenches being recessed to a second depth in the substrate that is less than the first depth,
the substrate including a plurality of active pillars protruding from a plurality of lower doped regions of the substrate, the plurality of lower doped regions of the substrate being separated from each other by the device isolation layer, the plurality of the active pillars being defined by the plurality of second trenches crossing the plurality of first trenches and the plurality of device isolation trenches,
each of the active pillars including an upper doped region on a channel region, the channel region being on the lower doped region,
the substrate including a string body connection portion between a bottom of the plurality of second trenches and a top of the plurality of lower doped regions, the string body connection portion connecting the channel regions of at least two of the plurality of active pillars that are adjacent to each other;
a contact gate electrode facing the channel region of at least one of the plurality of active pillars;
a word line connected to the contact gate electrode, the word line extending along a first direction over the substrate, the first direction being parallel to the plurality of second trenches;
a bit line connected to one of the plurality of lower doped regions, the bit line extending in one of the plurality of device isolation trenches along a second direction that crosses the first direction.

2. The device of claim 1, wherein a top surface of the string body connection portion is lower than a bottom surface of the upper doped regions of the plurality of active pillars.

3. The device of claim 2, wherein a conductivity type of the string body connection portion is the same as a conductivity type of the channel regions of the plurality of active pillars.

4. The device of claim 3, further comprising:
an insulating gap-fill pattern on the string body connection portion,
the insulating gap-fill pattern between the at least two active pillars of the plurality of active pillars that are adjacent to each other; and
a separation doped region in contact with a bottom surface of the insulating gap-fill pattern, wherein
the separation doped region is spaced apart from the plurality of lower doped regions,
a conductivity type of the separation doped region is the same as the conductivity type of the channel regions of the plurality of active pillars, and
an impurity concentration of the separation doped region is greater than an impurity concentration of the channel regions of the plurality of active pillars.

5. The device of claim 4, wherein the insulating gap-fill pattern extends along the first direction.

6. The device of claim 1, wherein the string body connection portion extends along the second direction to connect the channel regions of the at least two active pillars of the plurality of active pillars that are adjacent to each other.

7. The device of claim 1, wherein the string body connection portion is a pathway configured to extract holes from the channel regions of the at least two active pillars of the plurality of active pillars that are adjacent to each other.

8. The device of claim 1, further comprising:
at least one voltage generation portion electrically connected to the string body connection portion.

9. The device of claim 1, wherein the contact gate electrode is on top of the bit line.

10. The device of claim 1, wherein
the word line exposes a portion of a top surface of the contact gate electrode, and
the word line exposes at least a portion of a top surface of at least one of the plurality of active pillars below the word line.

11. The device of claim 10, wherein a vertical position of the word line does not to overlap with a vertical position of the plurality of active pillars.

12. The device of claim 1, further comprising:
a plurality of data storing elements electrically connected to the upper doped regions of the plurality of the active pillars.

13. The device of claim 1, wherein the lower doped regions of the plurality of active pillars have a line shape that extends along the second direction.

14. A semiconductor device, comprising:
a device isolation layer including a first trench recessed to a first depth in the device isolation layer;
a substrate including a device isolation trench crossing a second trench in the substrate,
the device isolation layer in the device isolation trench,
the second trench recessed to a second depth in the substrate that is less than the first depth,
the substrate including an active pillar protruding from a lower doped region of the substrate, the active pillar being defined by the second trench crossing the first trench and the device isolation trench,
the active pillar including an upper doped region on a channel region, the channel region being on the lower doped region,
the substrate including a string body connection portion between a bottom of the second trench and a top of the lower doped region, the string body connection portion being connected to the channel region;
a word line extending along a first direction over the substrate;
a contact gate electrode connected to the word line, the contact gate electrode facing the channel region;
a bit line connected to the lower doped region, the bit line extending in the device isolation trench along a second direction that crosses the first direction; and a string body connection portion connected to the channel region.

15. The device of claim 14, wherein the contact gate electrode is on top of the bit line.

16. A semiconductor device, comprising:
a plurality of vertical transistors arranged in rows and columns, each vertical transistor including,
a channel between a first and a second doped region, and
a gate electrode configured to apply a gate voltage to the channel region;
a plurality of word lines, each one of the plurality of word lines being connected to the gate electrodes of the plurality of vertical transistors in same row;
a plurality of bit lines, each one of the plurality of bit lines being connected to the first doped regions of the plurality of vertical transistors in same column, the gate electrode of the plurality of vertical transistors being on top of the plurality of bit lines; and
at least one string body connection portion that connects the channel regions of at least two of the plurality of vertical transistors, wherein
a vertical position of the at least one string body connection portion does not overlap with vertical positions of the bit lines, and
the vertical position of the at least one string body connection portion overlaps with vertical positions of the first and the second doped regions.

17. The semiconductor device of claim 16, wherein
the at least one string body connection portion extends between the channel and the first doped regions of at the least two of the plurality of the vertical transistors, and
the at least one string body connection portion is configured to extract holes from the channel regions of the at least two of the plurality of the vertical transistors.

18. The semiconductor device of claim 16, wherein
the at least one string body connection portion has a first conductivity type,
the channel regions of the plurality of the vertical transistors have a first conductivity type,
the first and the second doped regions of the plurality of the vertical transistors have a second conductivity type, and
the first conductivity type is opposite the second conductivity type.

19. The semiconductor device of claim 16, further comprising:
a plurality of data storage elements,
wherein each of the data storage elements is connected to one second doped region of the plurality of vertical transistors.

* * * * *